(12) United States Patent
Iwata

(10) Patent No.: US 9,058,856 B2
(45) Date of Patent: Jun. 16, 2015

(54) SEMICONDUCTOR MEMORY DEVICE

(71) Applicant: Kabushiki Kaisha Toshiba, Minato-ku (JP)

(72) Inventor: Yoshihisa Iwata, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 120 days.

(21) Appl. No.: 13/970,815

(22) Filed: Aug. 20, 2013

(65) Prior Publication Data
US 2014/0241029 A1    Aug. 28, 2014

Related U.S. Application Data

(60) Provisional application No. 61/770,732, filed on Feb. 28, 2013.

(51) Int. Cl.
*G11C 5/06* (2006.01)
*G11C 5/02* (2006.01)
*G11C 7/04* (2006.01)
*G11C 13/00* (2006.01)

(52) U.S. Cl.
CPC ............. *G11C 5/063* (2013.01); *G11C 5/025* (2013.01); *G11C 7/04* (2013.01); *G11C 13/0004* (2013.01); *G11C 13/0007* (2013.01);
(Continued)

(58) Field of Classification Search
CPC ....... G11C 5/063; G11C 7/18; G11C 11/4097
USPC ...................................................... 365/63, 51
See application file for complete search history.

(56) References Cited

U.S. PATENT DOCUMENTS 5,590,072 A    12/1996  Choi
6,567,287 B2    5/2003  Scheuerlein
(Continued)

FOREIGN PATENT DOCUMENTS

JP    2731128    12/1997
JP    2006-41174    2/2006
(Continued)

OTHER PUBLICATIONS

H. Matsuoka et al. "A New Vertically Stacked Poly-Si MOSFET with Partially Depleted SOI Operation for Densely Integrated SoC Applications", 2004 VLSI Technology. 22.4, pp. 234-235.
(Continued)

*Primary Examiner* — Son Dinh
(74) *Attorney, Agent, or Firm* — Oblon, McClelland, Maier & Neustadt, L.L.P.

(57) ABSTRACT

A memory cell array comprises first wiring lines, second wiring lines, and memory cells disposed at intersections thereof. A control circuit comprises a first power-supply line supplying a first voltage to selected ones of the first or second wiring lines, and first selection circuits connected between the first or second wiring lines and the first power-supply line, each first selection circuit comprising first and second transistors connected in series. The first selection circuits arranged along a first direction are connected to a first selection line. The first selection circuits arranged along a second direction perpendicular to the first direction are commonly connected to a second selection line. The first and second transistors each comprise a columnar semiconductor portion extending in a direction perpendicular to a semiconductor substrate, a gate-insulating film in contact with a side surface of the columnar semiconductor, and a gate electrode in contact with the gate-insulating film.

20 Claims, 25 Drawing Sheets

(52) U.S. Cl.
CPC ......... *G11C 13/0023* (2013.01); *G11C 13/004* (2013.01); *G11C 2013/0054* (2013.01); *G11C 2213/18* (2013.01); *G11C 2213/53* (2013.01); *G11C 2213/71* (2013.01)

(56) References Cited

U.S. PATENT DOCUMENTS

| | | | |
|---|---|---|---|
| 6,831,854 | B2 | 12/2004 | Rinerson et al. |
| 7,221,576 | B2 * | 5/2007 | Fujisawa et al. ............... 365/63 |
| 7,227,781 | B2 | 6/2007 | Iizuka |
| 7,471,545 | B2 * | 12/2008 | Nii ............................... 365/154 |
| 8,278,695 | B2 | 10/2012 | Kidoh et al. |

FOREIGN PATENT DOCUMENTS

| | | |
|---|---|---|
| JP | 4768557 | 6/2011 |
| JP | 2011-138962 | 7/2011 |

OTHER PUBLICATIONS

Christophe J. Chevallier et al. "A 0.13μm 64Mb Multi-Layered Conductive Metal-Oxide Memory", ISSCC 2010 /Session 14 / Non-Volatile Memory /14.3, pp. 260-261.

M.-J. Lee et al. "Stack Friendly All-Oxide 3D RRAM using GaInZnO Peripheral TFT realized over Glass Substrates", IEEE 2008, pp. 85-88.

Matthew Crowley et al. "512Mb PROM with 8 Layers of Antifuse/Diode Cells", ISSCC 2003/ Session 16/ Non-Volatile Memory/ Paper 16.4, 10 pages.

Mark Johnson et al. "512-Mb PROM with a Three-Dimensional Array of Diode/Antifuse Memory Cells", IEEE Journal of Solid-State Circuits, vol. 38, No. 11, Nov. 2003, pp. 1920-1928.

\* cited by examiner

SEMICONDUCTOR MEMORY DEVICE

CROSS REFERENCE TO RELATED APPLICATIONS

This application is based on and claims the benefit of priority from prior U.S. Provisional Patent Application No. 61/770,732, filed on Feb. 28, 2013, the entire contents of which are incorporated herein by reference.

FIELD

The embodiments described in the present specification relate to a semiconductor memory device.

BACKGROUND

Recently, as the degree of integration of a semiconductor memory device increases, the memory cells included in the semiconductor memory device become more miniaturized. Meanwhile, the miniaturization of a select transistor for selectively supplying voltages to the memory cells does not catch up the miniaturization advance of the memory cells because of the necessity to achieve the characteristics as the select transistor and the restriction of a breakdown voltage. Therefore, a problem arises in that the ratio of the occupied area of the select transistor to the surface area of the semiconductor memory device increases.

DETAILED DESCRIPTION

The following embodiments describe a semiconductor memory device comprising: a memory cell array, the memory cell array comprising a plurality of first wiring lines, a plurality of second wiring lines, and a plurality of memory cells disposed at intersections of the first and second wiring lines; and a control circuit operative to control voltages supplied to the first or second wiring lines by controlling a select transistor.

The control circuit comprises a first power-supply line configured to supply a first voltage supplied to selected ones of the first or second wiring lines, and first selection circuits connected between the first or second wiring lines and the first power-supply line, each first selection circuit comprising a first transistor and a second transistor connected in series. The first selection circuits arranged along a first direction are connected to a first selection line. The first selection circuits arranged along a second direction perpendicular to the first direction are commonly connected to a second selection line.

Each of the first and second transistors comprises a columnar semiconductor portion extending in a direction perpendicular to a semiconductor substrate, a gate-insulating film in contact with a side surface of the columnar semiconductor, and a gate electrode in contact with a gate-insulating film.

With reference to the drawings, a semiconductor memory device according to the embodiments will now be described in more detail. Note that although the following embodiments illustrate examples in which a so-called resistive random access memory is used as a memory device, the memory cell may have various configurations that do not depart from the spirit of the following embodiments.

First Embodiment

Figure 1:
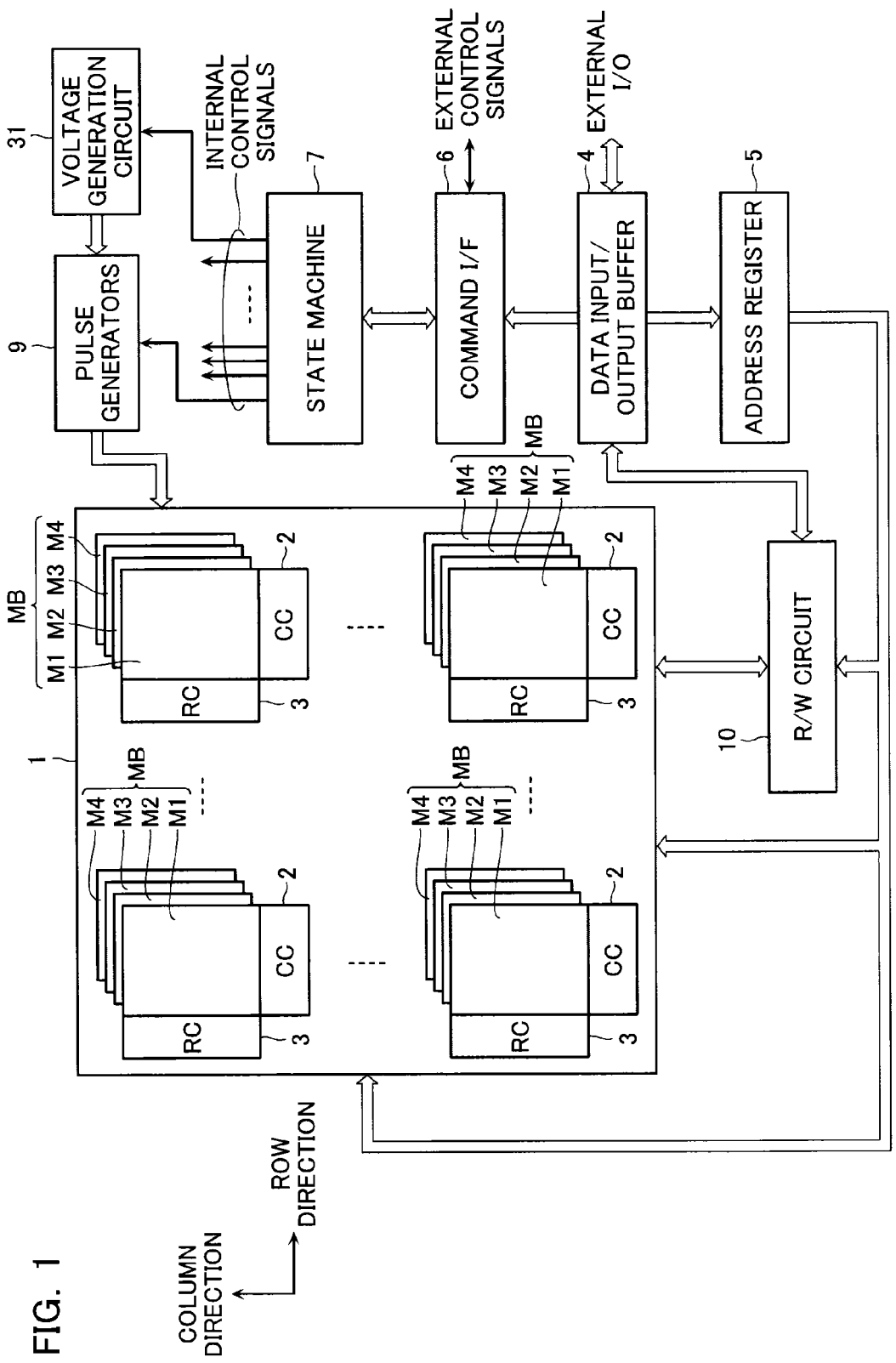
FIG. 1 is a block diagram of a semiconductor memory device according to a first embodiment.

Referring first to FIG. 1 to FIG. 4, a schematic configuration of a semiconductor memory device according to an embodiment will be described. FIG. 1 is a block diagram of the semiconductor memory device (a non-volatile memory) according to the embodiment.

With reference to FIG. 1, the semiconductor memory device according to the embodiment comprises a memory cell array 1 comprising memory cells arranged in a matrix, each memory cell comprising a resistive random access memory (ReRAM) described below. The memory cell array 1 comprises an arrangement of a plurality of memory blocks MB, each memory block MB comprising a stack of a plurality of (here, four) memory mats Ml to M4. One memory mat M comprises bit-lines BL and word-lines WL provided in a crossing manner, and memory cells MC connected to the intersections of the bit-lines BL and the word-lines WL.

Each memory mat M has a column control circuit 2 (CC) adjacent thereto in the bit-line BL direction. The column control circuit 2 controls voltages supplied to the bit-lines BL and performs data erase of the memory cells, data write to the memory cells, and data read from the memory cells. The column control circuits 2 may be formed in a region below the memory cell array 1, as described below.

Each memory mat M also has a row control circuit 3 adjacent thereto in the word-line WL direction. The row control circuit 3 selects a word-line WL of the memory cell array 1 and controls voltages necessary for the data erase of the memory cells, the data write to the memory cells, and the data read from the memory cells. The row control circuit 3 may also be formed in a region below the memory cell array 1, as described below.

Note, however, that it is not absolutely necessary to dispose the column control circuit 2 and the row control circuit 3 in a region below the memory cell array 1. Disposing the column control circuit 2 and the row control circuit 3 in a region below the memory cell array 1 is absolutely one means to reduce the circuit area of the semiconductor memory device, and it will be appreciated that any other means may be used for the same purpose.

A data input/output buffer 4 is connected to a not-shown external host via an I/O line. The data input/output buffer 4 receives write data, receives an erase command, outputs read data, and receives address data and command data. The data input/output buffer 4 sends received data to a read/write control circuit 10, and receives read data from the read/write control circuit 10 and outputs the data externally. An address externally supplied to the data input/output buffer 4 is sent, via an address register 5, to the read/write control circuit 10, the column control circuits 2, and the row control circuits 3. The host supplies a command to the data input/output buffer 4, which is then sent to a command interface 6.

The command interface 6 receives an external control signal from the host, and determines whether data input to the data input/output buffer 4 is write data, a command, or an address. If the data is a command, the command interface 6 transfers the data to a state machine 7 as a received command signal. The state machine 7 is configured to manage the entire memory. The state machine 7 receives a command from the host and manages read, write, erase, and data input/output or the like. The external host may also receive status information managed by the state machine 7 and determine the operation result. The status information is also used to control the write and erase.

The state machine 7 also controls a pulse generator 9. The control may allow the pulse generator 9 to output, according to a voltage generated by a potential generation circuit 31, a pulse of any voltage and any timing. The formed pulse may then be transferred to any wiring lines selected by the column control circuits 2 and the row control circuits 3.

Figure 2A:
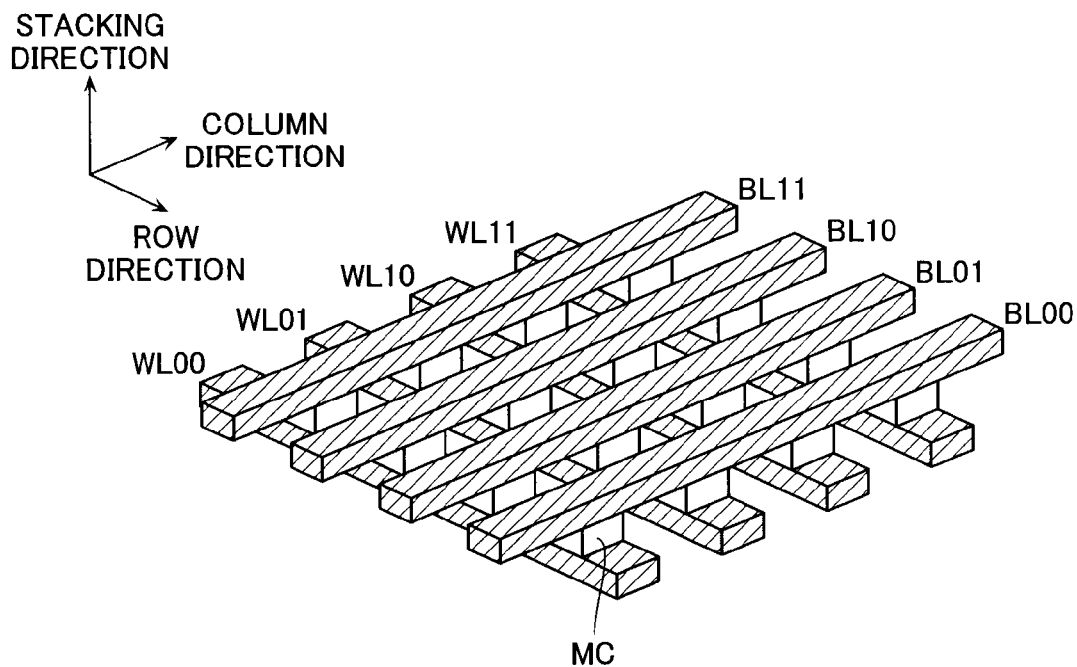
FIG. 2A is a perspective view of one memory mat Mi (i=1 to 4) in a memory cell array 1 in the semiconductor memory device according to the first embodiment.
Figure 2B:
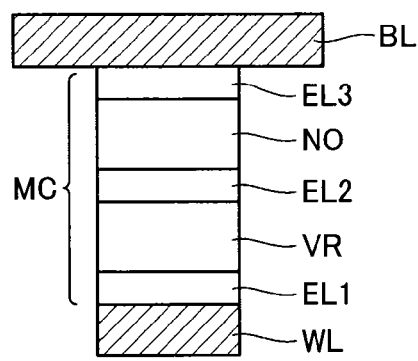
FIG. 2B is a cross-sectional view of one memory cell MC in the semiconductor memory device according to the first embodiment.

FIG. 2A is a perspective view of one memory mat Mi (i=1 to 4) in the memory cell array 1. FIG. 2B is a cross-sectional view of one memory cell. With reference to FIG. 2A, the memory mat Mi comprises a plurality of bit-lines BL, a plurality of word-lines WL, and a plurality of memory cells MC connected between the bit-lines BL and the word-lines WL at the intersections thereof. Although FIG. 2A only shows four bit-lines BL and four word-lines WL, the number of bit-lines BL and word-lines WL is not limited to that shown in FIG. 2A.

With reference to FIG. 2B, one memory cell MC comprises a series-connected circuit comprising a resistive random access memory VR and a non-ohmic device NO. With reference to FIG. 2B, the memory cell MC comprises, in sequence in the direction from the word-line WL to the bit-line BL, an electrode EL1, the resistance change element VR, an electrode EL2, the non-ohmic device NO, and an electrode EL3.

The resistance change element VR is a device that may change, when applied with a voltage, its resistance via current, heat, chemical energy, or the like. The electrodes EL1 and EL2 are disposed below and above the resistance change element VR. These electrodes EL1 and EL2 function as a barrier metal and a bonding layer. A material such as Pt, Au, Ag, TiAlN, SrRuO, Ru, RuN, Ir, Co, Ti, TiN, TaN, LaNiO, Al, PtIrOx, PtRhOx, and Rh/TaAlN is used as the electrode material. Further, a metal film may be inserted for uniform orientation. Further, other layers such as a buffer layer, a barrier metal layer, and a bonding layer may be separately inserted.

The resistance change element VR may comprise the following elements: an element such as chalcogenide that may change the resistance via a phase transition between a crystalline state and a noncrystalline state (PCRAM); an element that may change the resistance by forming cross-links (contacting bridges) between electrodes via metal cation precipitation or by breaking the cross-links by ionizing precipitated metal (CBRAM); and an element that may change the resistance by an applied voltage or current (ReRAM) (that is broadly classified into two types, one changing the resistance by the presence or absence of charge trapped in a charge trap at an electrode interface, and the other one changing the resistance by the presence or absence of a conductive path due to oxygen defect or the like).

Preferably, the bit-lines BL and the word-lines WL comprise materials that are thermally resistant and have low resistance, such as W, WSi, NiSi, CoSi, Mo, RuW, $RuO_2$, and $IrO_2$. The non-ohmic device NO has, for example, a Metal-Insulator-Metal (MIM) structure or a P+poly-Silicon-Intrinsic-N+ poly-Silicon (PIN structure) or the like. Again, the electrodes EL2 and EL3 forming the barrier metal layer and the bonding layer may be inserted. Further, the MIM structure may perform the bipolar operation. Further, the PIN structure (diode structure) may perform the unipolar operation by its characteristics.

Figure 3:
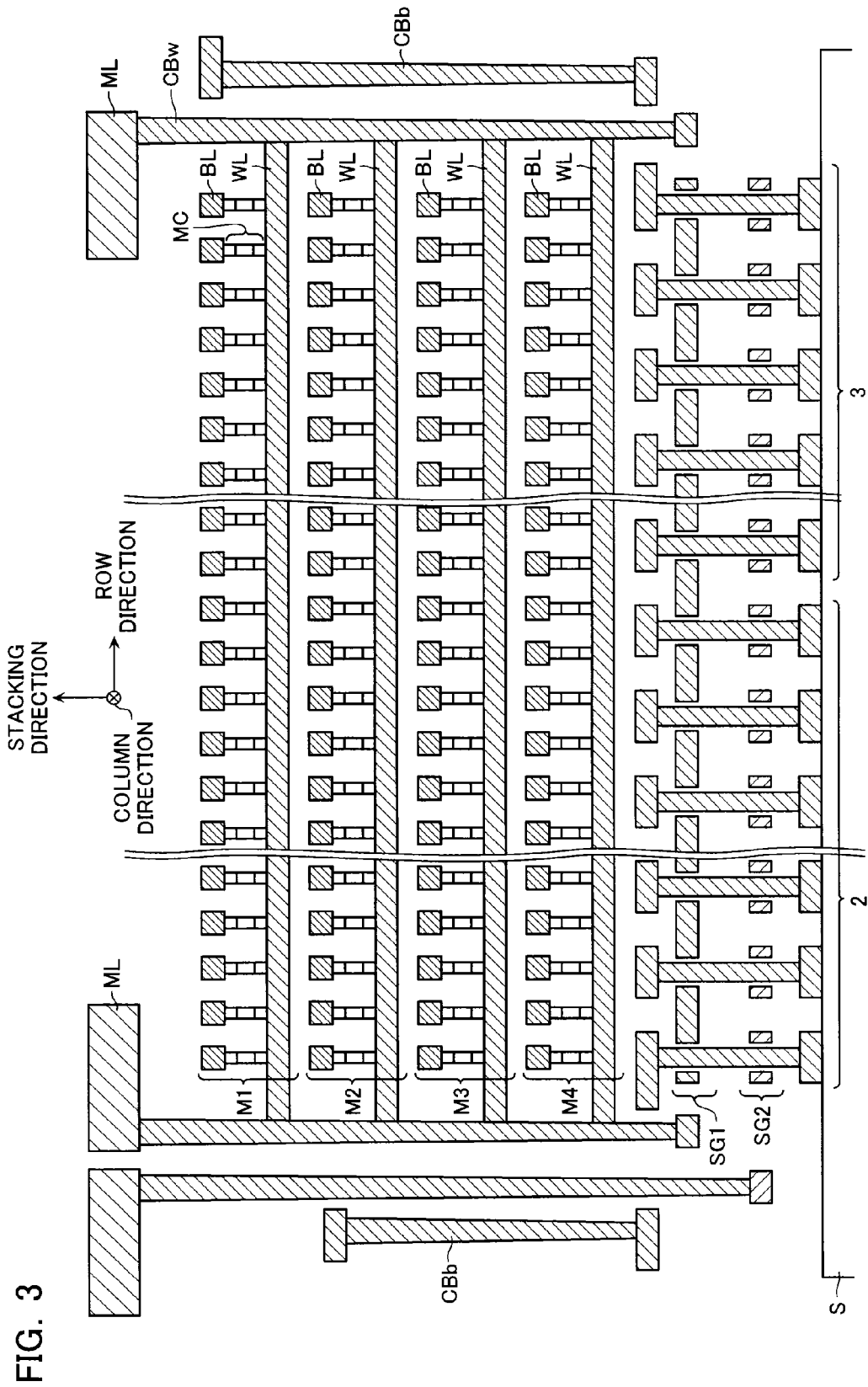
FIG. 3 is a schematic cross-sectional view of the memory cell array 1 and underlying column control circuit 2 and row control circuit 3 in the semiconductor memory device according to the first embodiment.

FIG. 3 is a schematic cross-sectional view of the memory cell array 1 and the underlying column control circuit 2 and row control circuit 3.

As described above, each memory block MB in the memory cell array 1 comprises a stack of a plurality of (for example, four layer) memory mats M1 to M4 on a semiconductor substrate S. The column control circuit 2 and the row control circuit 3 are formed on the semiconductor substrate S in a region below the memory cell array 1. Each of the control circuits 2 and 3 comprises a large number of selection circuits (SCP, SCN, and SCN') arranged in a matrix. Each selection circuit comprises two vertical select transistors connected in series.

Note that the bit-lines BL and the word-lines WL are formed over multiple layers in the memory mats MAT 1 to MAT 4, and connected to different contacts CBb and CBw, respectively. Alternatively, the bit-lines BL over multiple layers may be connected to respective independent contacts CBb, while the word-lines WL over multiple layers may be commonly connected to one contact CBw. Conversely, the word-lines WL over multiple layers may be connected to respective independent contacts CBw, while the bit-lines BL over multiple layers may be commonly connected to one contact CBb. Alternatively, a modified example may be used in which, for example, among the word-lines WL or bit-lines BL over multiple layers, the word-lines WL or bit-lines BL in odd-numbered layers may be commonly connected to one contact, while the word-lines WL or bit-lines in even-numbered layers may be commonly connected to another contact.

Figure 4:
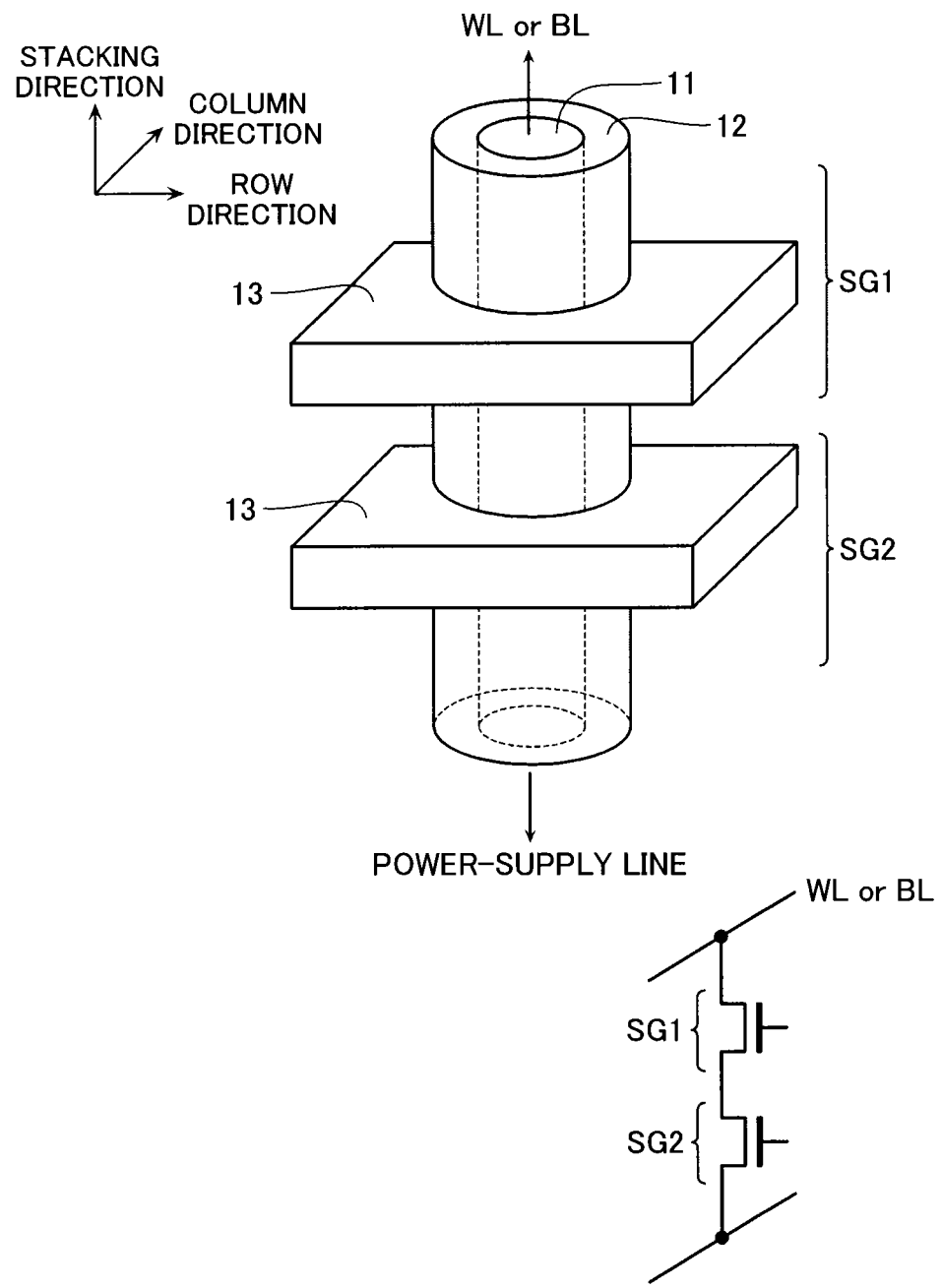
FIG. 4 is a perspective view of a configuration of one selection circuit.

FIG. 4 is a perspective view of a configuration of one selection circuit (SCP, SCN, or SCN'). The selection circuit comprises vertical select transistors SG1 and SG2 connected in series. The select transistors SG1 and SG2 comprise a columnar semiconductor portion 11. The columnar semiconductor portion 11 extends in the stacking direction (the direction perpendicular to the semiconductor substrate S) as the longitudinal direction. The columnar semiconductor portion 11 comprises polysilicon or the like. The columnar semiconductor portion 11 is added with impurities. The types of impurities depends on the conductivity types (p-type or n-type) of the select transistors SG1 and SG2. The select transistors SG1 and SG2 may share one columnar semiconductor portion 11, or may comprise independent columnar semiconductor portions 11. The columnar semiconductor portion 11 has a first end connected to the word-lines WL or bit-lines BL via contacts or metal wiring lines (not shown in FIG. 4). The columnar semiconductor portion 11 has a second end connected to a power-supply line as described below.

The columnar semiconductor portion 11 is surrounded by a gate-insulating film 12 comprising a silicon oxide film or the like. Although FIG. 4 shows that the gate-insulating film 12 fully surrounds the columnar semiconductor portion 11, alternatively, a gate-insulating film may be used that is in contact with one side surface of the columnar semiconductor portion 11.

In addition, since the columnar semiconductor portion only needs to exist where it is in contact with the gate-insulating film 12, the layer 11 may be a semiconductor layer of a hollow shape. The columnar semiconductor portion 11 may also have a structure comprising a hollow semiconductor layer having a hollow portion embedded with an insulating film. Alternatively, the columnar semiconductor portion 11 may have a structure comprising a hollow semiconductor layer having a hollow portion filled with gas.

In addition, the gate-insulating film 12 is surrounded by gate electrodes 13 in contact therewith. The gate electrodes 13 applied with a predetermined voltage switch the select transistors SG1 and SG2 to a conduction state.

Note that assuming the diameter of the columnar semiconductor 11 as R, the thickness of the gate-insulating film 12 as T, the thickness of the gate electrode 13 as O, and the pitch between adjacent gate electrodes 13 as S, the sizes of R, T, O, and S may be set to different values depending on the required breakdown voltages of the select transistors. By way of example, to withstand the electric field of 5 MV/cm, the sizes may be roughly R=20 nm, T=20 nm, O=50 nm, and S=20 nm.

Note that not all the selection circuits need to comprise a vertical transistor. As necessary, some of the selection circuits may comprise a planar transistor.

Figure 5:
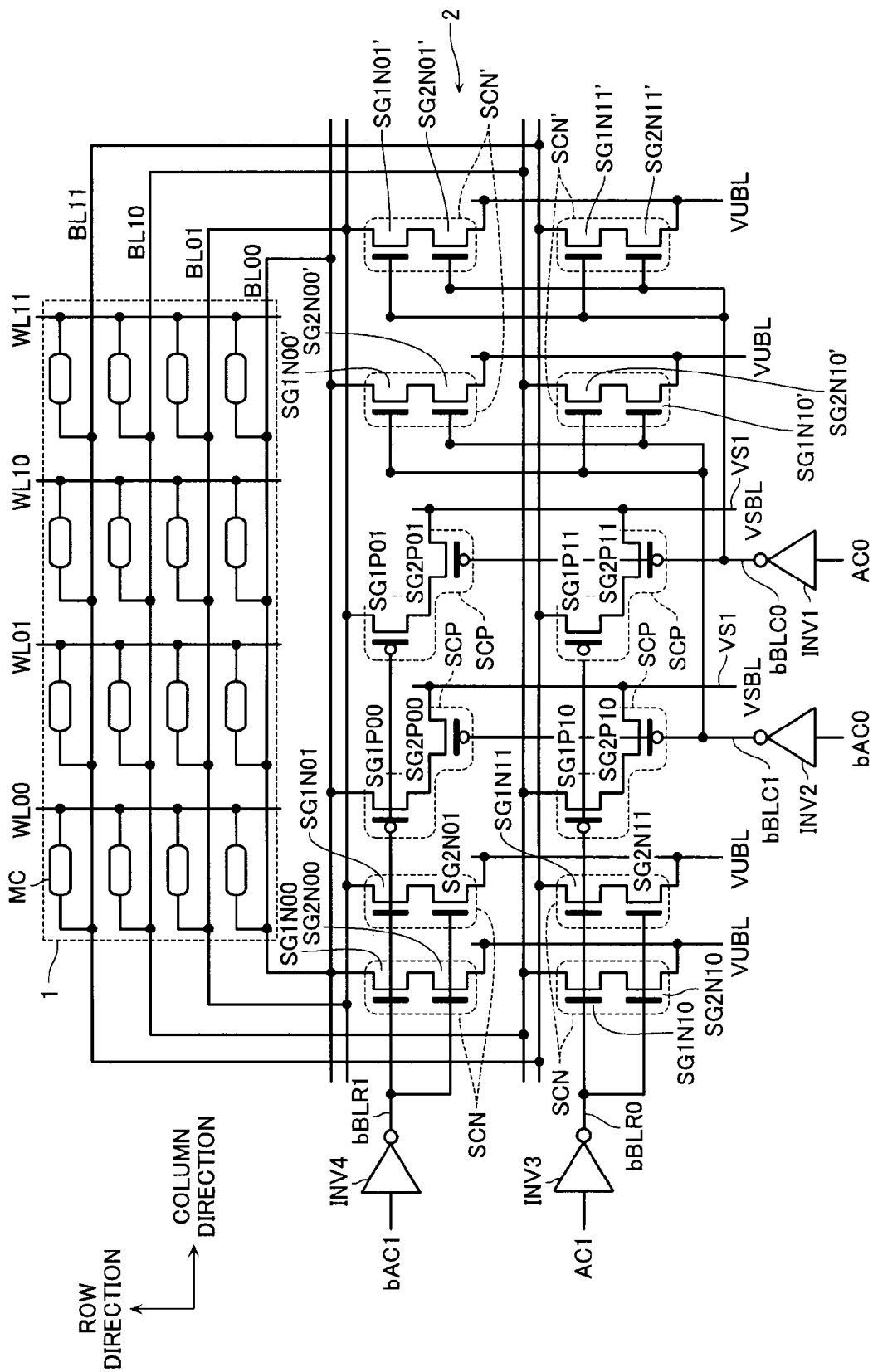
FIG. 5 is an equivalent circuit diagram of an example configuration of the column control circuit 2.

FIG. 5 is an equivalent circuit diagram of an example configuration of the column control circuit 2. For ease of illustration, it is assumed here that the memory cell array 1 comprises four bit-lines BL of bit-lines BL00, BL01, BL10, and BL11 and four word-lines WL of word-lines WL00, WL01, WL10, and WL11.

In this case, one bit-line BL is connected to one selection circuit SCP, which comprises PMOS transistors connected in series, and two selection circuits SCN and SCN', each of which comprises NMOS transistors connected in series. For example, focusing attention on the bit-line BL00, the bit-line BL00 is connected to a selection circuit SCP comprising PMOS transistors SG1P00 and SG2P00 connected in series, a selection circuit SCN comprising NMOS transistors SG1N00 and SG2N00 connected in series, and a selection circuit SCN' comprising NMOS transistors SG1N00' and SG2N00' connected in series. The same holds true for the other bit-lines BL.

The selection circuit SCP is connected to, at the other end thereof, a power-supply line VS1 supplying a voltage VSBL. In other words, the selection circuit SCP is connected to form a current path between a bit-line BL and the power-supply line VS1. The voltage VSBL is a voltage to be supplied to a selected bit-line BL.

Meanwhile, the selection circuits SCN and SCN' are connected to, at the other ends thereof, respective power-supply lines VS2 supplying a voltage VUBL. In other words, the selection circuits SCN and SCN' are connected to form current paths between bit-lines BL and the power-supply lines VS2. The voltage VUBL is a voltage to be supplied to a non-selected bit-line BL.

The four selection circuits SCP, which are provided corresponding to the four bit-lines BL00, BL01, BL10, and BL11, respectively, are arranged in a 2×2 matrix. In addition, the selection circuits SCN are arranged, in a region on the left side of the selection circuits SCP, in a 2×2 matrix. Further, the selection circuits SCN' are arranged, in a region on the right side of the selection circuits SCP, in a 2×2 matrix. The layout of the selection circuits SCP, SCN, and SCN' is not limited to that in FIG. 5 and various layouts may be applied that may achieve the objective operations. This will be apparent from the description below.

In addition, the column control circuit 2 is input with signals AC0, AC1, bAC0, and bAC1 to selectively drive the four bit-lines BL01 to BL11. The signals bAC0 and bAC1 are the inverted signals of the signals AC0 and AC1, respectively. The four bit-lines BL01 to BL11 are alternatively selected by a 2-bit signal expressed by the signals AC0 and AC1.

The signals AC0 and bAC0 are input to the input terminals of the inverters INV1 and INV2, respectively. The output terminals of the inverters INV1 and INV2 output the inverted signals of the signals AC0 and bAC0, which are then supplied to selection lines bBLC0 and bBLC1.

The signals AC1 and bAC1 are input to the input terminals of the inverters INV3 and INV4, respectively. The output terminals of the inverters INV3 and INV4 output the inverted signals of the signals AC1 and bAC1, which are then supplied to selection lines bBLR0 and bBLR1.

The selection lines bBLC0 and bBLC1 extend in the row direction as the longitudinal direction. Each selection line is commonly connected to a row direction array of the selection circuits SCP. Meanwhile, the selection lines bBLR0 and bBLR1 extend in the column direction as the longitudinal direction. Each selection line is commonly connected to a column direction array of the selection circuits SCP.

The selection lines bBLR0 and bBLR1 extend in the column direction as the longitudinal direction. Each selection line is commonly connected to a column direction array of the selection circuits SCN. Meanwhile, the selection lines bBLC0 and bBLC1 extend in the row direction as the longitudinal direction as described above. Each selection line is commonly connected to a row direction array of the selection circuits SCN'.

Figure 6:
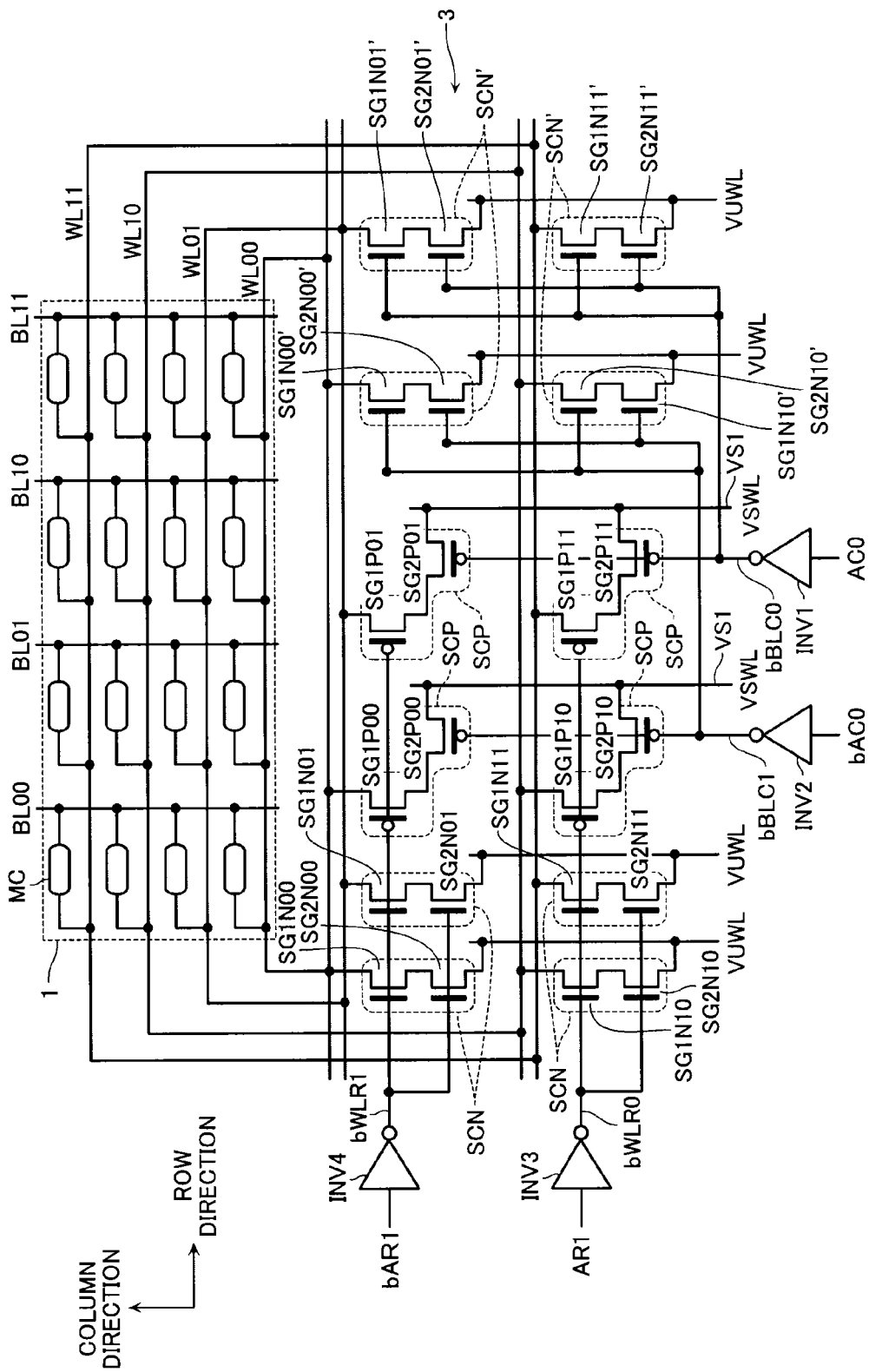
FIG. 6 is an equivalent circuit diagram of an example configuration of the row control circuit 3.

FIG. 6 is an equivalent circuit diagram of an example configuration of the row control circuit 3. The detailed configuration is the same as that of the column control circuit 2, and its description is omitted here. In FIG. 6, like elements as those in FIG. 5 are designated with like reference symbols.

Figure 7:
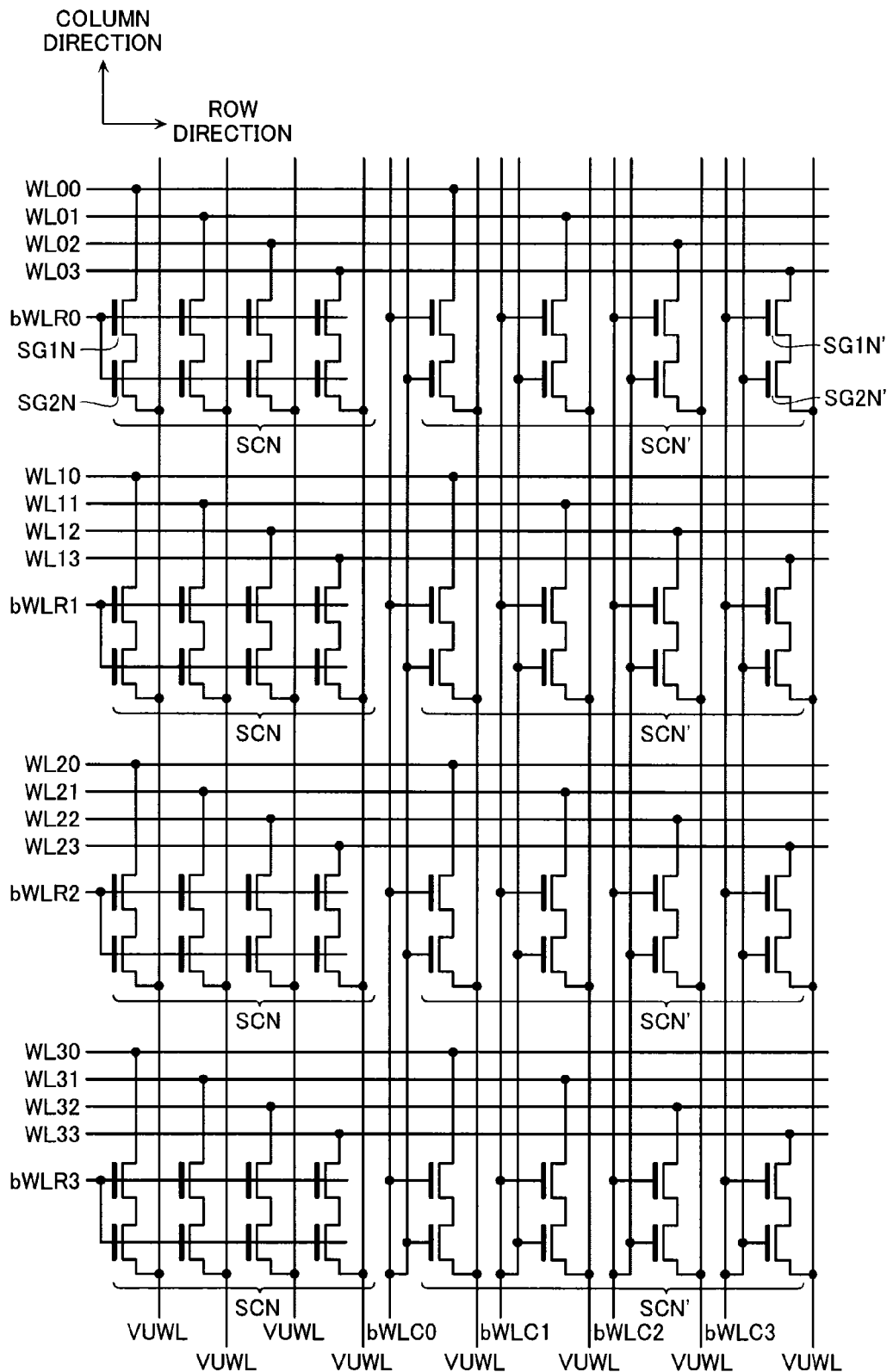
FIG. 7 shows equivalent circuits of selection circuits SCN and SCN' in the row control circuit 3 for 16 word-lines WL (WL00 to WL33) in the semiconductor memory device according to the first embodiment.
Figure 8:
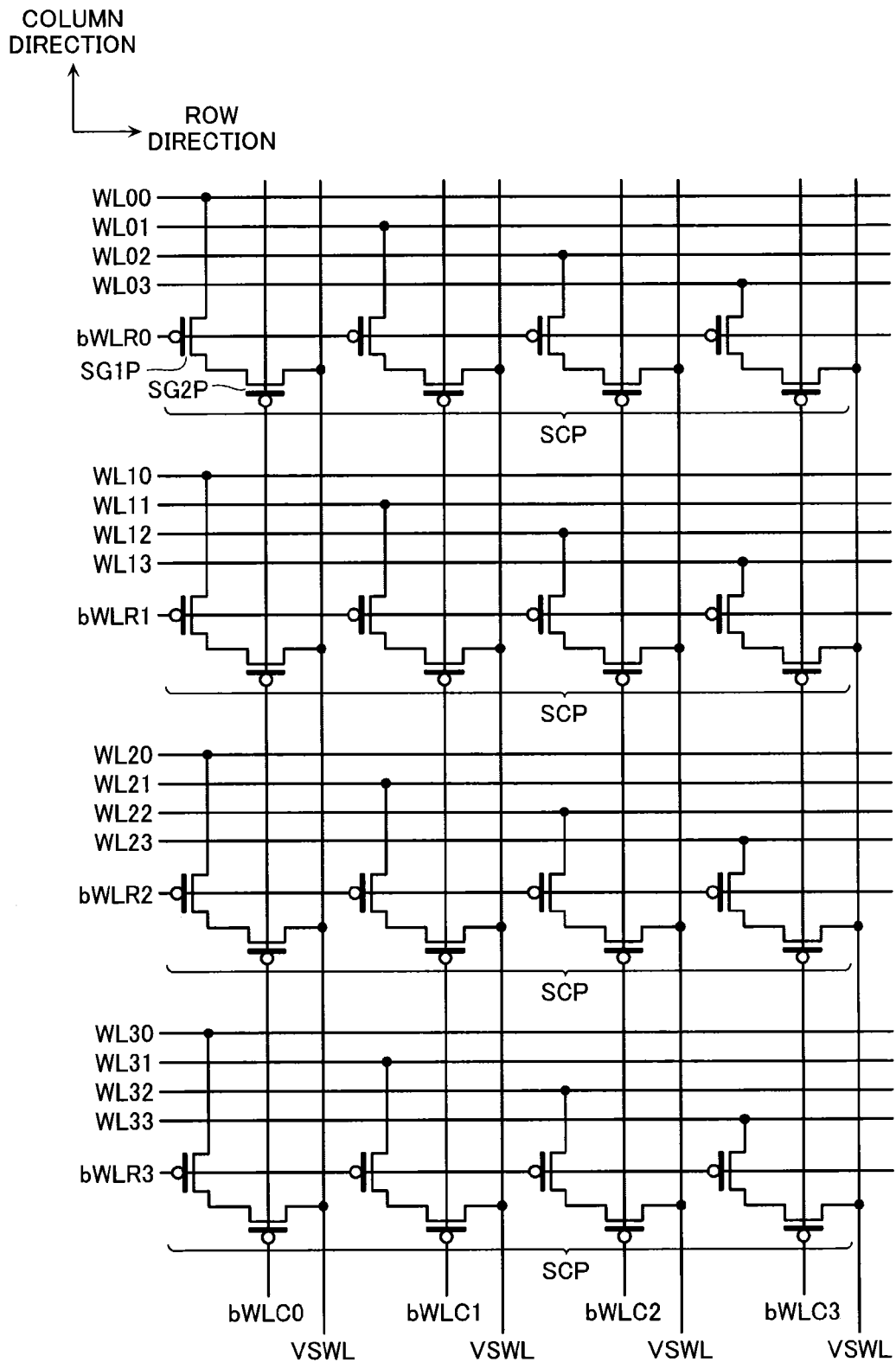
FIG. 8 shows equivalent circuits of selection circuits SCP in the row control circuit 3 for 16 word-lines WL (WL00 to WL33) in the semiconductor memory device according to the first embodiment.

FIGS. 7 and 8 show a layout of the selection circuits SCP, SCN, and SCN' in the row control circuit 3 when there are 16 word-lines WL (WL00 to WL33). For the convenience of the description, FIG. 7 shows only the selection circuits SCN and SCN' as an excerpt, and FIG. 8 shows only the selection circuits SCP as an excerpt. Note that the selection circuits SCP, SCN, and SCN' in the column control circuit 2 when there are 16 bit-lines BL may have the same configuration, and their description is omitted here.

As shown in FIGS. 7 and 8, even when there are 16 word-lines WL, one word-line WL is connected to one selection circuit SCP, one selection circuit SCN, and one selection circuit SCN'. This is the same as when there are 4 word-lines WL shown in FIG. 6.

With reference to FIG. 7, each row direction array of the selection circuits SCN is commonly connected to the same selection line bWLR0, bWLR1, bWLR2, or bWLR3. In addition, each column direction array of the selection circuits SCN' is commonly connected to the same selection line bWLC0, bWLC1, bWLC2, or bWLC3.

Further, with reference to FIG. 8, each row direction array of the selection circuits SCP is commonly connected to the same selection line bWLR0, bWLR1, bWLR2, or bWLR3. In addition, each column direction array of the selection circuits SCP is commonly connected to the same selection line bWLC0, bWLC1, bWLC2, or bWLC3. These characteristics are also the same as those in FIG. 6. The above characteristics hold true irrespective of the number of word-lines WL.

Figure 9:
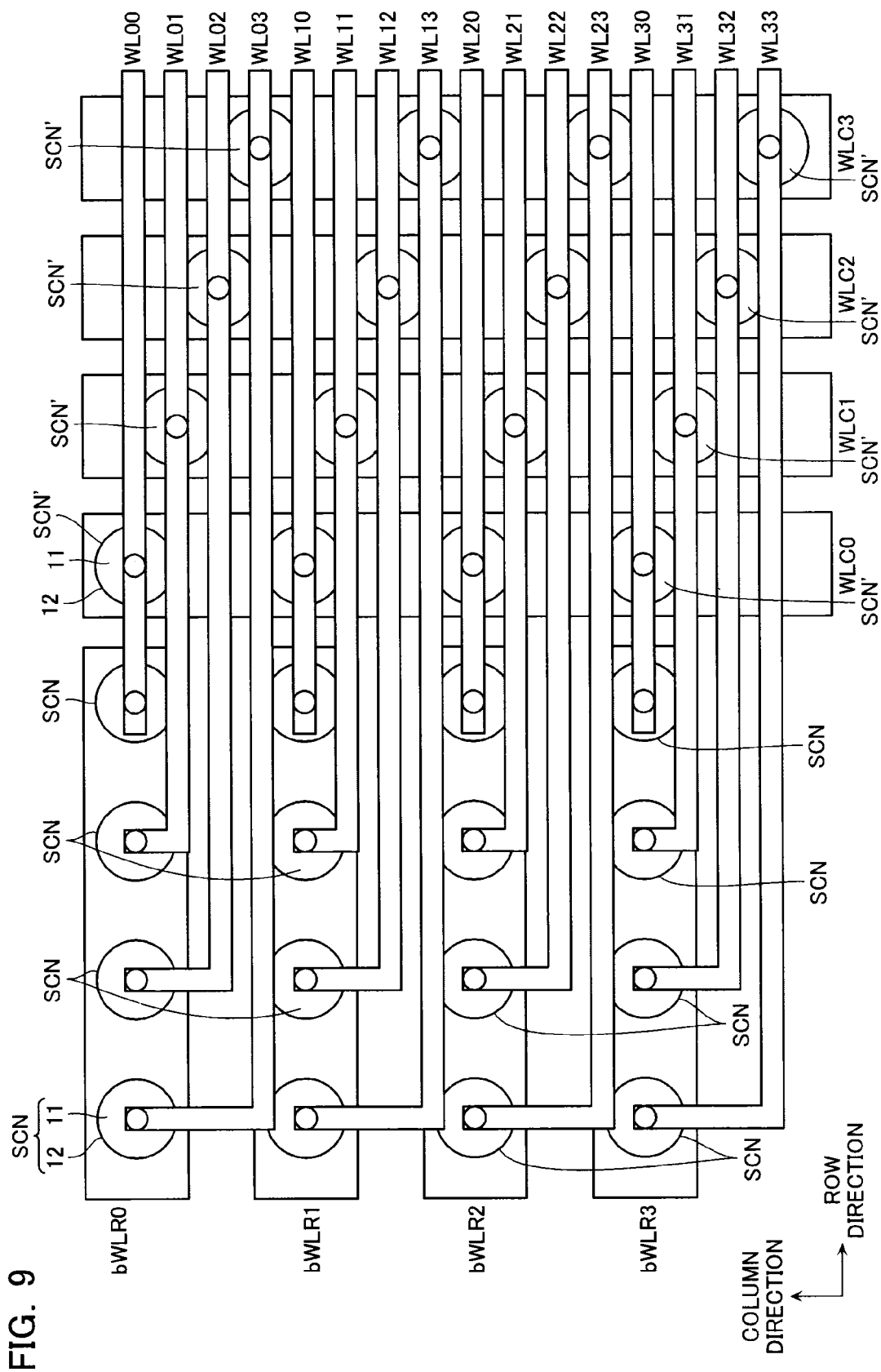
FIG. 9 shows an actual planar layout of the portions of the selection circuits SCN and SCN' in the semiconductor memory device according to the first embodiment.
Figure 10:
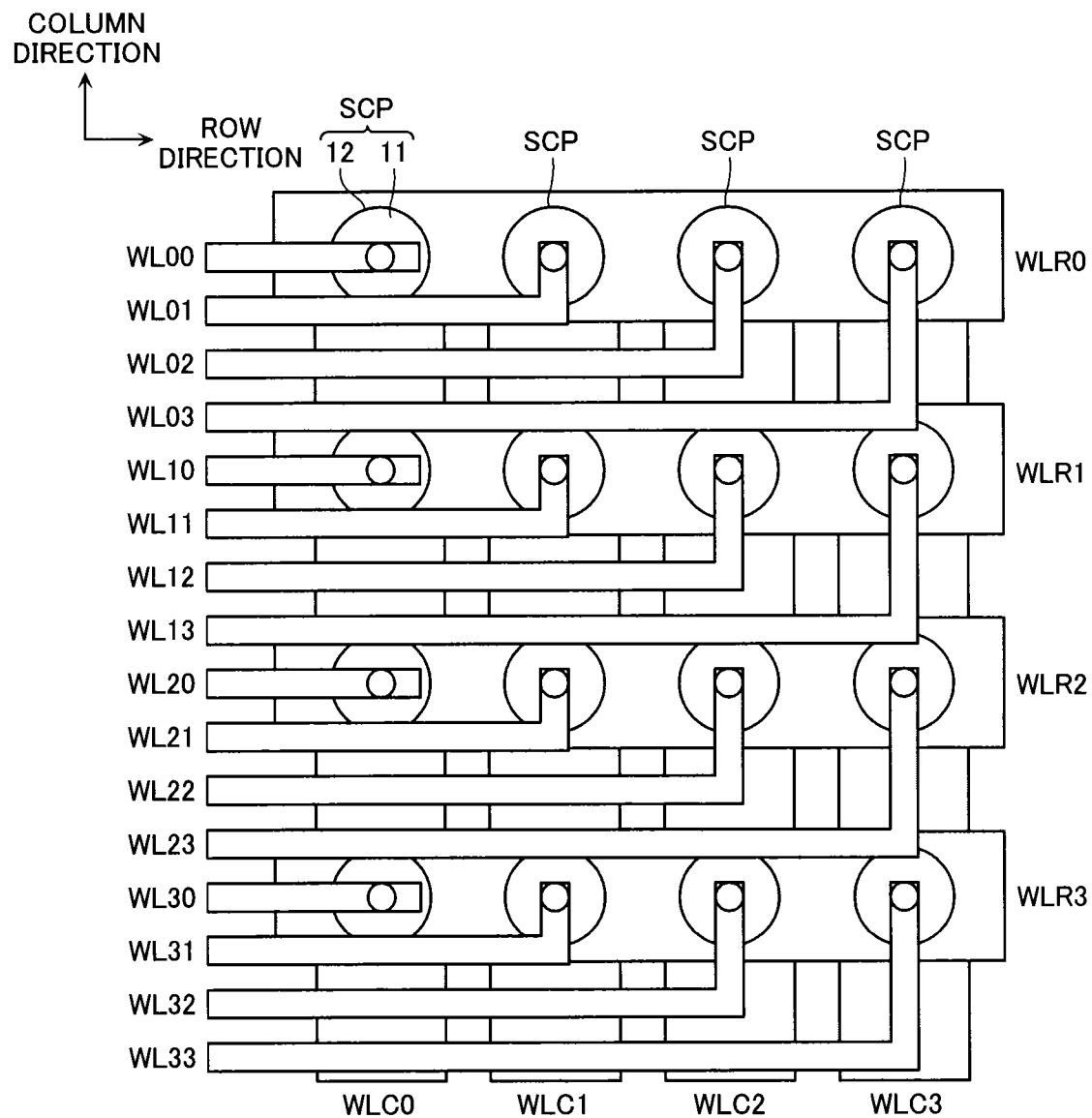
FIG. 10 shows an actual planar layout of the portions of the selection circuits SCP in the semiconductor memory device according to the first embodiment.
Figure 11:
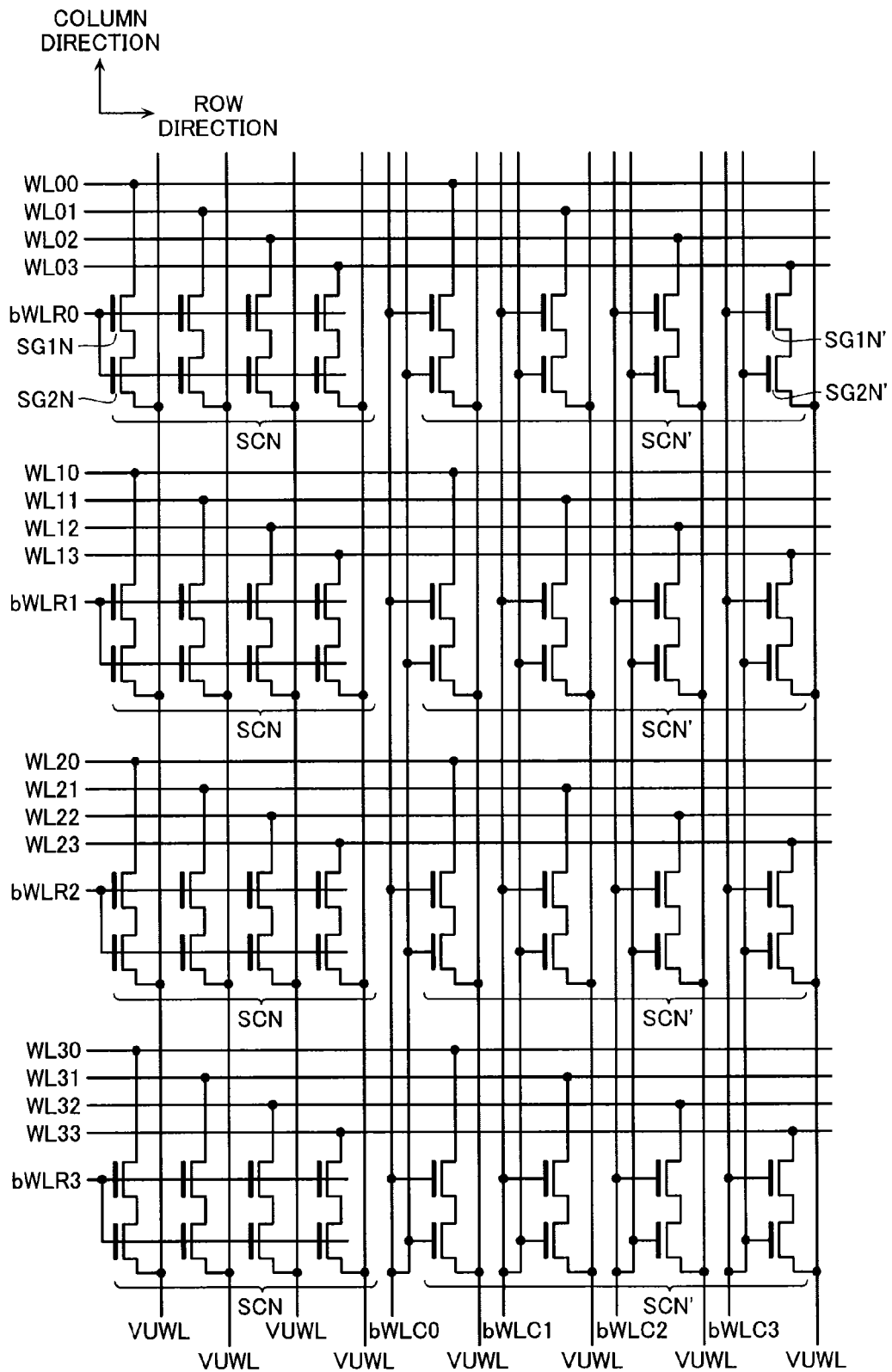
FIG. 11 shows equivalent circuits of selection circuits SCN and SCN' in a row control circuit 3 for 16 word-lines WL (WL00 to WL33) in a semiconductor memory device according to a second embodiment.

FIG. 9 is an actual planar layout of the portions of the selection circuits SCN and SCN'. FIG. 10 is an actual planar layout of the portions of the selection circuits SCP. In FIG. 9, the selection circuits SCN and SCN' are formed such that their columnar semiconductors 11 extend in a direction perpendicular to the plane as the longitudinal direction.

Then, the row direction arrays of the selection circuits SCN are connected to the same selection lines bWLR0 to bWLR3, respectively. The selection lines bWLR0 to bWLR3 also function as the gate electrodes 13 shown in FIG. 4 and are formed to surround the columnar semiconductors 11 via the gate-insulating films 12. In addition, the column direction arrays of the selection circuits SCN' are connected to the same selection lines bWLC0 to bWLC3, respectively. The selection lines bWLC0 to bWLC3 also function as the gate electrodes 13 shown in FIG. 4, and are formed to surround the columnar semiconductors 11 via the gate-insulating films 12.

(Effects of First Embodiment)

As described above, in the semiconductor memory device according to the first embodiment, the selection circuits included in each column control circuit 2 and each row control circuit 3 are arranged in a matrix, and the transistors in each selection circuit comprise a vertical transistor. If the transistors included in each selection circuit are formed by usual planar transistors, the occupied area of one select transistor reaches from almost ten times to several ten times the occupied area of one memory cell. If a vertical transistor is used as the select transistor as in this embodiment, the occupied area of one select transistor is about 2 to 3 times the occupied area of one memory cell. Thus, the column control circuit 2 and the row control circuit 3 may be reasonably formed in a region below the memory cell array 1. In particular, the selection circuit according to this embodiment comprises two MOS transistors SG1 and SG2 connected in series. Therefore, if the selection circuit comprises a plane transistor, the occupied area increases significantly. If, however, the selection circuit comprises a vertical transistor, even two MOS transistors connected in series do not increase the occupied area.

Further, the selection circuits arranged in a matrix as described above may be alternatively selected by the selection lines extending in the row and column directions as the longitudinal directions and crossing each other. This may thus reduce the occupied areas of the column control circuit 2 and the row control circuit 3, and also the total area of the semiconductor memory device.

Second Embodiment

Referring now to FIG. 11 to FIG. 14, a semiconductor memory device according to a second embodiment will be described. The entire configuration in this embodiment is the same as that in the first embodiment (FIGS. 1 to 4). In addition, with reference to FIG. 11, the planar layout of the selection circuits SCN and SCN' are the same as that in the first embodiment (FIG. 7).

Figure 12:
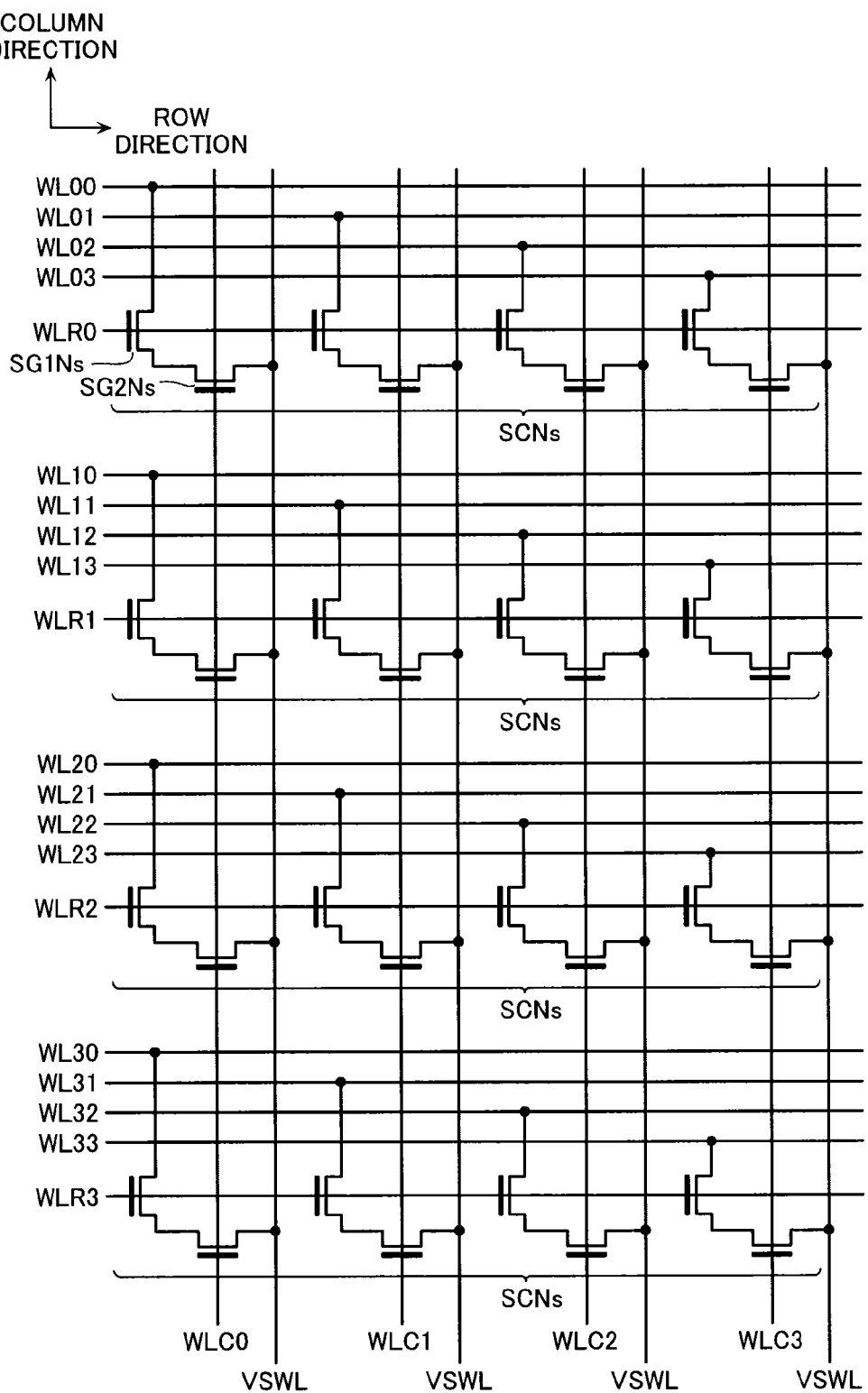
FIG. 12 shows equivalent circuits of selection circuits SCNs in the row control circuit 3 for 16 word-lines WL (WL00 to WL33) in the semiconductor memory device according to the second embodiment.
Figure 13:
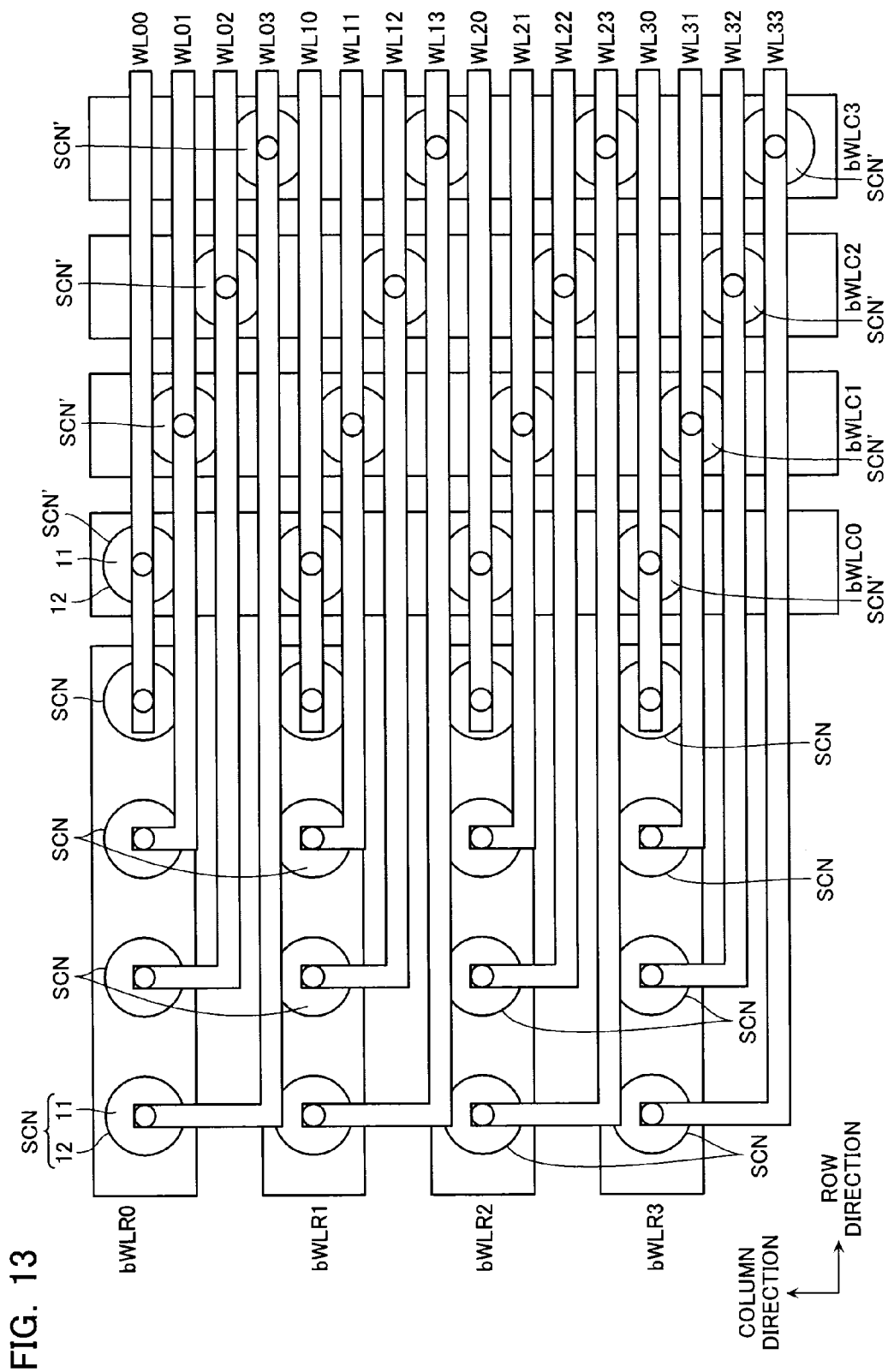
FIG. 13 shows an actual planar layout of the portions of the selection circuits SCN and SCN' in the semiconductor memory device according to the second embodiment.
Figure 14:
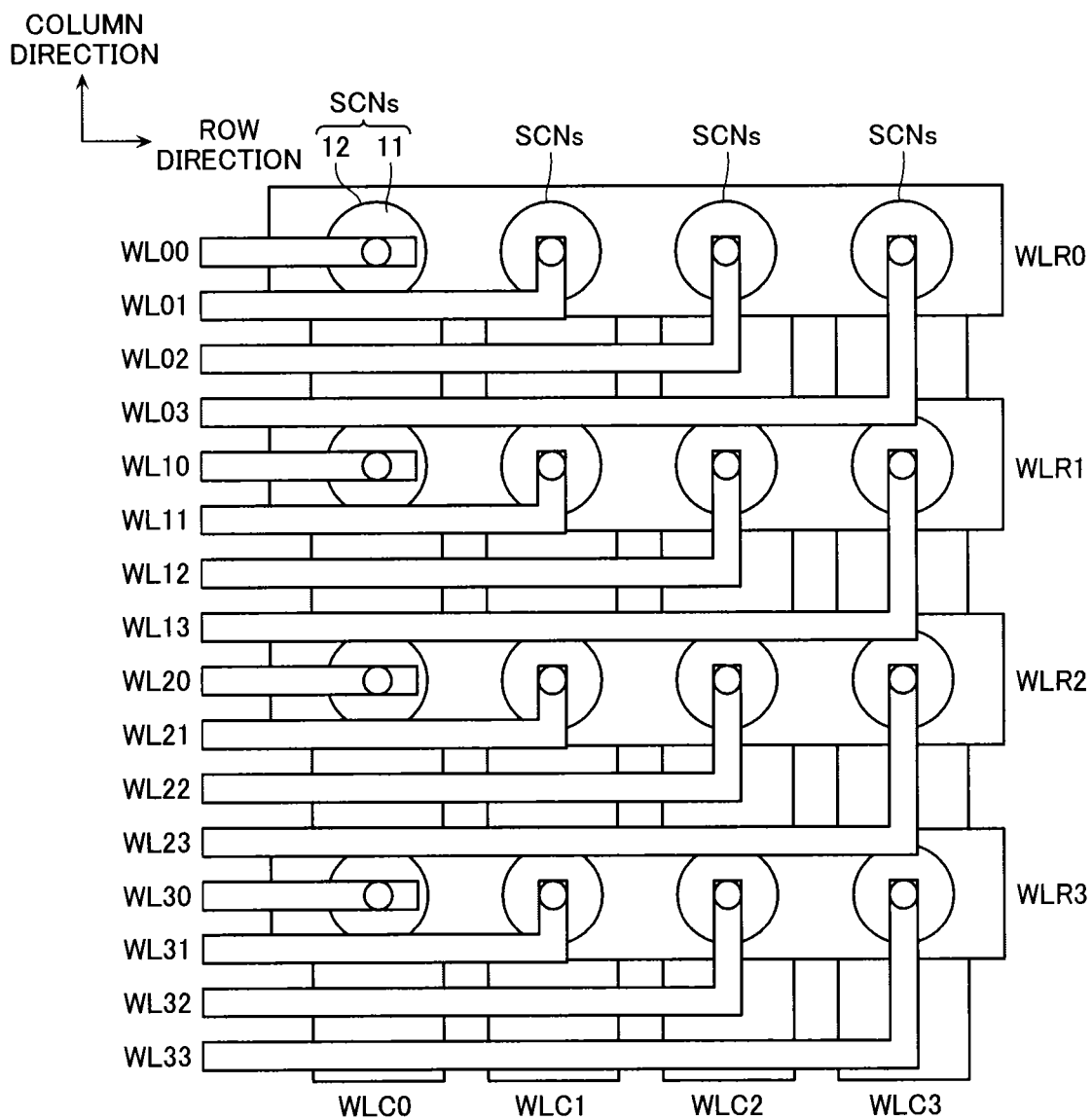
FIG. 14 shows an actual planar layout of the portions of the selection circuits SCP in the semiconductor memory device according to the second embodiment.

Note, however, that as shown in FIG. 12, the second embodiment comprises selection circuits SCNs, each of which comprises n-type MOS transistors (SG1Ns and SG2Ns), instead of the selection circuits SCP, each of which comprises p-type MOS transistors. The selection circuits SCNs supply voltages to the selected word-lines. The planar layouts are as shown in FIG. 13 and FIG. 14 and generally the same as those in the first embodiment. The second embodiment may also provide generally the same effect as in the first embodiment.

Third Embodiment

Figure 15:
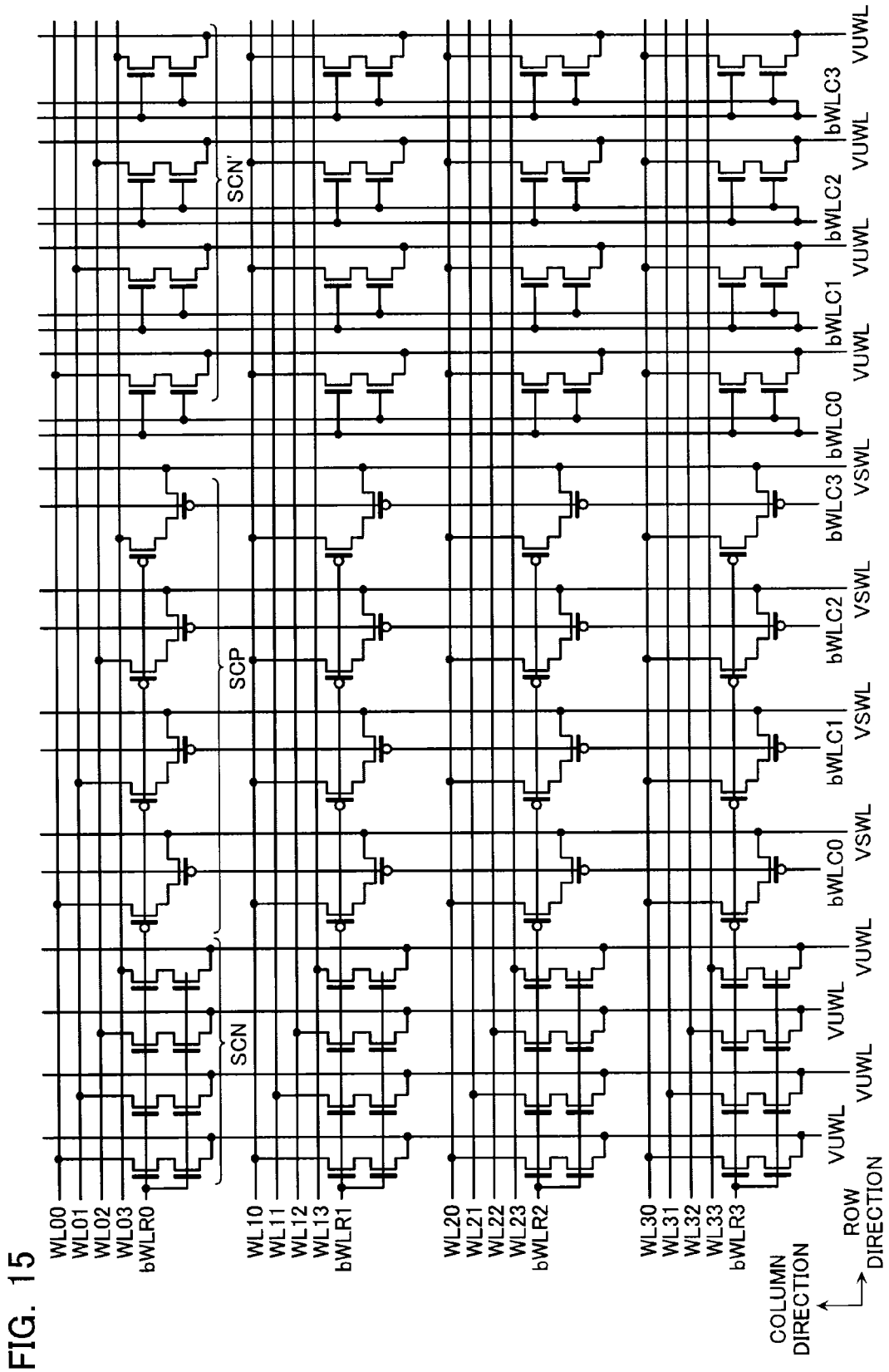
FIG. 15 shows equivalent circuits of selection circuits SCP, SCN and SCN' of a row control circuit 3 for 16 word-lines WL (WL00 to WL33) in a semiconductor memory device according to a third embodiment.
Figure 16:
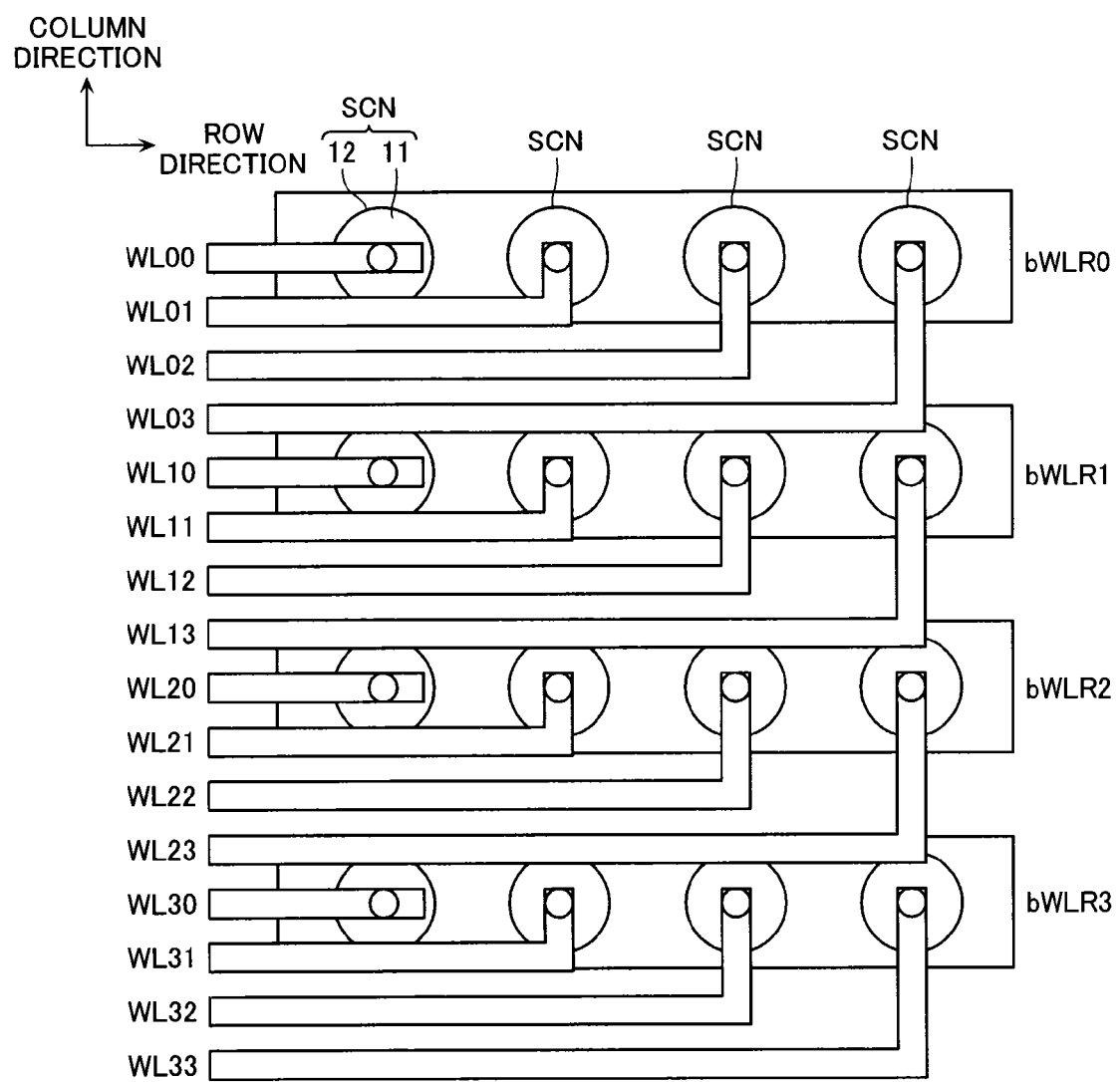
FIG. 16 shows an actual planar layout of the portions of the selection circuit SCNs in the semiconductor memory device according to the third embodiment.
Figure 17:
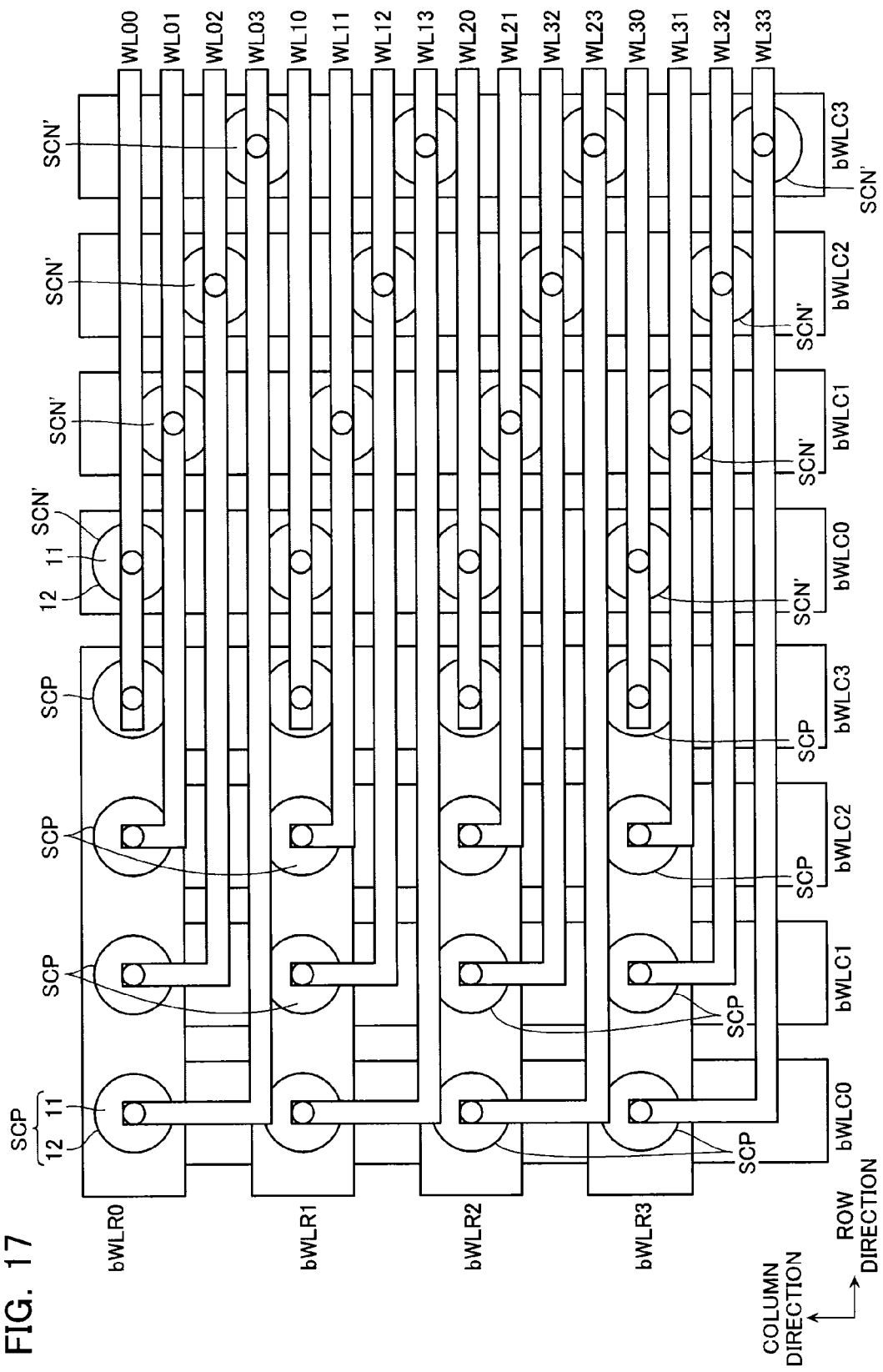
FIG. 17 shows an actual planar layout of the portions of the selection circuits SCP and SCN' in the semiconductor memory device according to the third embodiment.

Referring now to FIG. 15 to FIG. 17, a semiconductor memory device according to a third embodiment will be described. The entire configuration in this embodiment is the same as that in the first embodiment (FIG. 1 to FIG. 4). Note, however, that this embodiment has different layouts of the selection circuits SCP, SCN, and SCN' in the column control circuit 2 and the row control circuit 3.

FIG. 15 is an equivalent circuit diagram of the row control circuit 3. In this embodiment, the selection circuits SCP are formed between a region in which the selection circuits SCN are arranged and a region in which the selection circuits SCN' are arranged. FIG. 16 is an actual planar layout of a region in which the selection circuits SCN are arranged. FIG. 17 is an actual planar layout of a region in which the selection circuits SCP and SCN' are arranged. The third embodiment may also provide generally the same effect as in the first embodiment.

Fourth Embodiment

Figure 18:
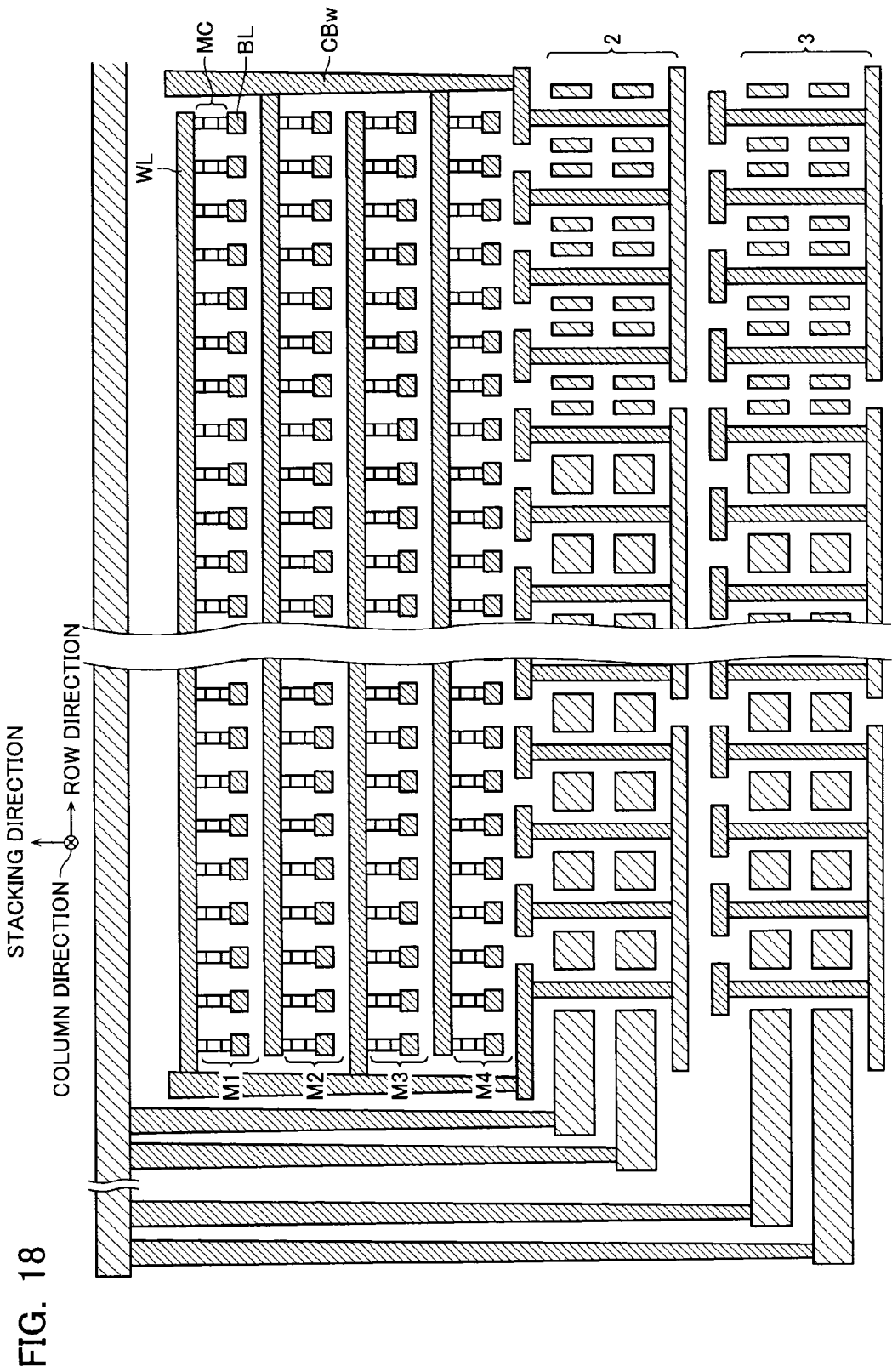
FIG. 18 is a schematic cross-sectional view of a memory cell array 1 and underlying column control circuit 2 and row control circuit 3 in a semiconductor memory device according to a fourth embodiment.

Referring now to FIG. 18, a semiconductor memory device according to a fourth embodiment will be described. This embodiment is different from the above embodiments in that the column control circuit 2 is formed in a region immediately below the memory cell array 1 and the row control circuit 3 is formed in a region immediately below the column control circuit 2. Otherwise, the fourth embodiment is similar to the above embodiments.

Fifth Embodiment

Figure 19:
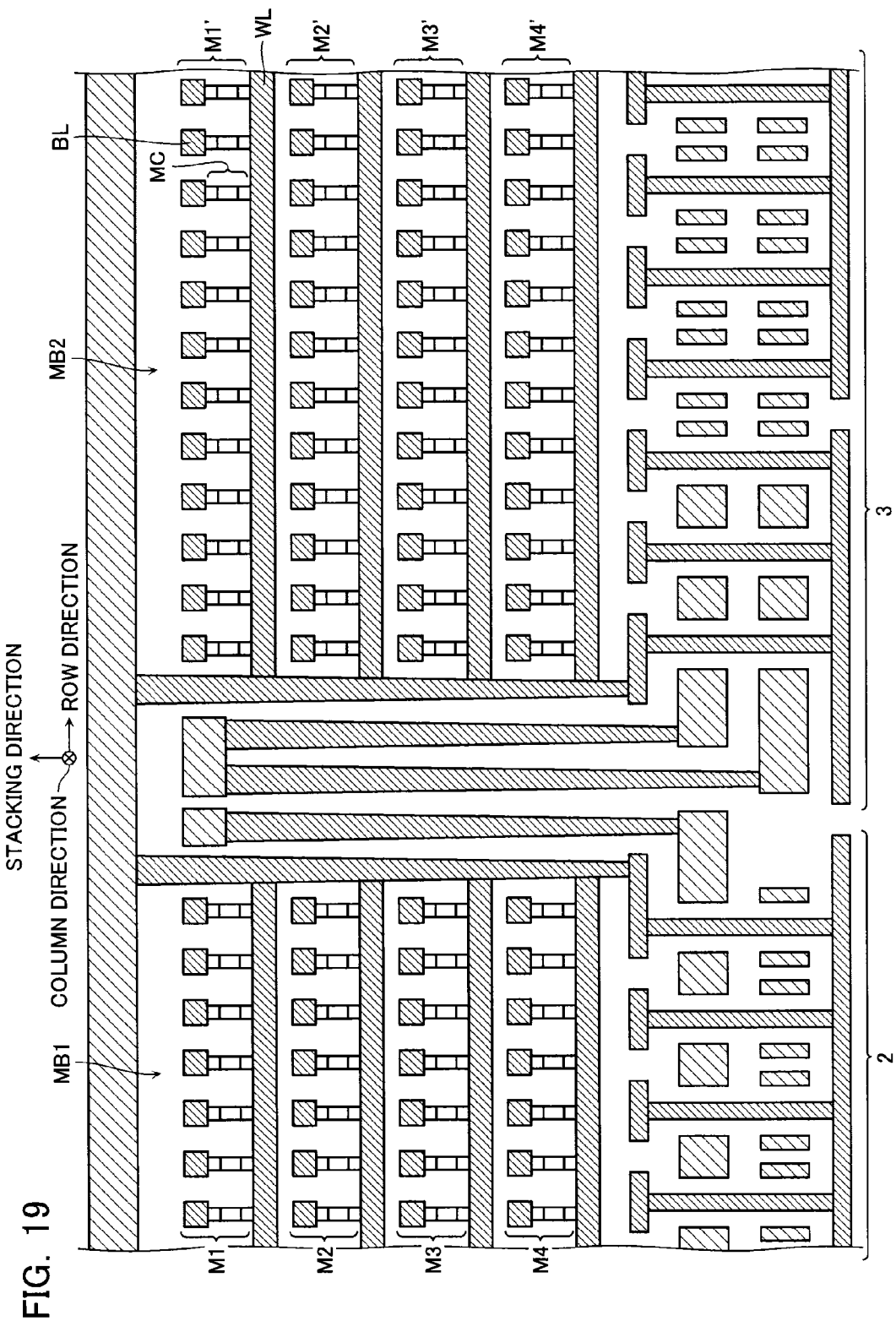
FIG. 19 is a schematic cross-sectional view of a memory cell array 1 and underlying column control circuit 2 and row control circuit 3 in a semiconductor memory device according to a fifth embodiment.

Referring now to FIG. 19, a semiconductor memory device according to a fifth embodiment will be described. This embodiment is different from the above embodiments in that two memory blocks MB1 and MB2 share the column control circuit 2 and the row control circuit 3. In other words, the column control circuit 2 is connected to the memory block MB1 immediately thereabove as well as connected to another memory block MB2. In addition, the row control circuit 3 is connected to the memory block MB2 immediately thereabove as well as connected to the memory block MB1. Otherwise, the fifth embodiment is similar to the above embodiments.

Sixth Embodiment

Referring now to FIG. 20 to FIG. 26, a semiconductor memory device according to a sixth embodiment will be described.

Figure 20:
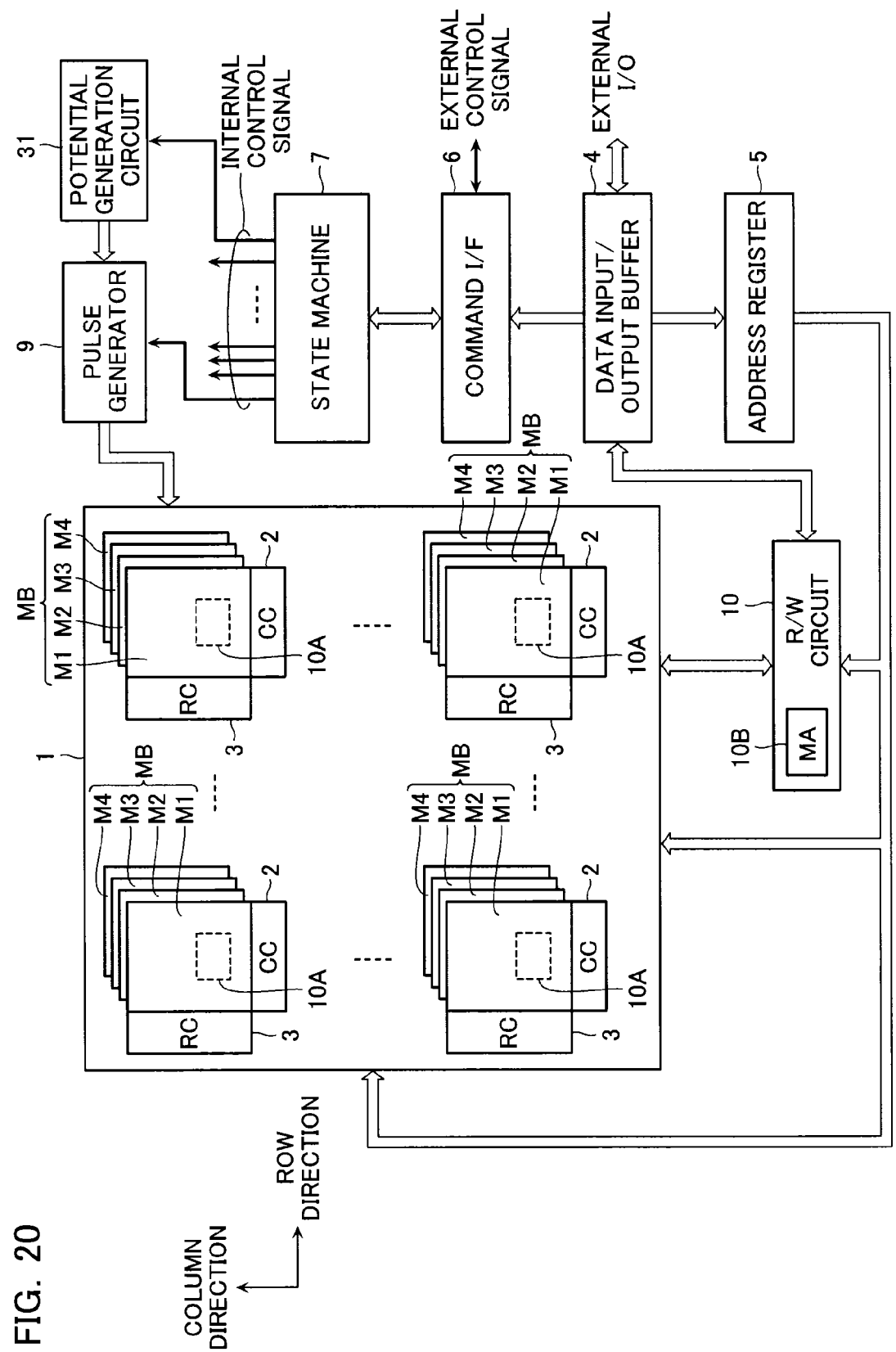
FIG. 20 is a block diagram of a semiconductor memory device according to a sixth embodiment.

With reference to FIG. 20, this embodiment is different from the above embodiments in that the sense amplifier circuit, which is an element of the read/write control circuit 10, comprises a plurality of pre-amplifier circuits 10A and a main amplifier circuit 10B, and the pre-amplifier circuits 10A are formed in regions immediately below the memory blocks MB, respectively. The pre-amplifier circuits 10A are provided for the respective memory blocks MB. The number of pre-amplifier circuits 10A is thus the same as the number of memory blocks MB. Meanwhile, the main amplifier circuit 10B is commonly provided to the pre-amplifier circuits 10A. Other configurations may be similar to those in the above embodiments.

Figure 21:
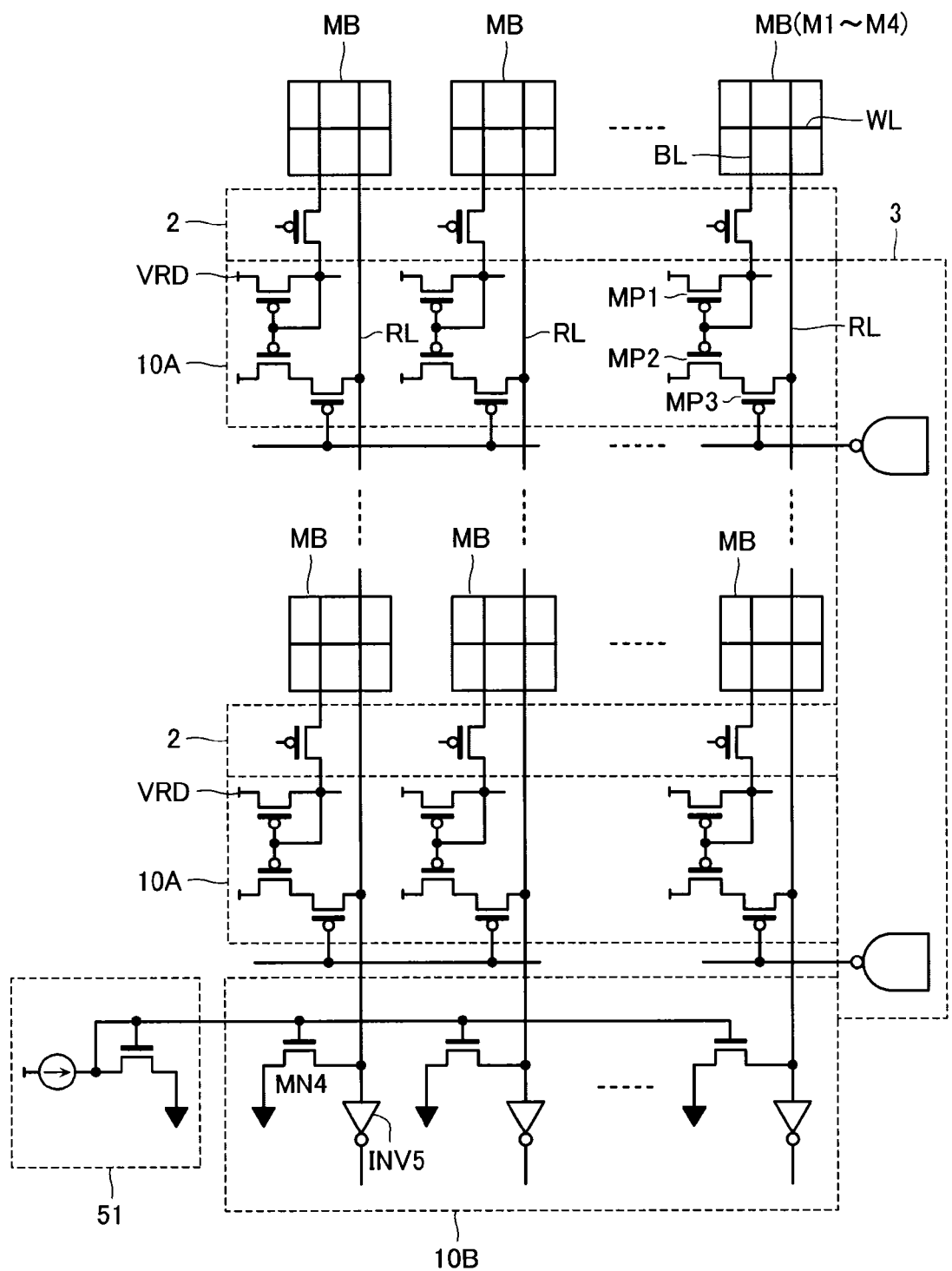
FIG. 21 shows circuitry examples of a pre-amplifier circuit 10A and a main amplifier circuit 10B according to the sixth embodiment.

FIG. 21 shows a circuitry example of the pre-amplifier circuit 10A and the main amplifier circuit 10B in the sixth embodiment.

Although FIG. 21 shows a schematic configuration of the column control circuit 2, similar configurations to the above embodiments may be applied. The same holds true for the row control circuit 3.

The pre-amplifier circuit 10A comprises p-type MOS transistors MP1 to MP3. The p-type MOS transistors MP1 and MP2 are current-mirror connected and have gates connected to the bit-lines BL via the column control circuits 2. The p-type MOS transistors MP3 are connected between the drains of the p-type MOS transistors MP2 and read lines RL.

Figure 22:
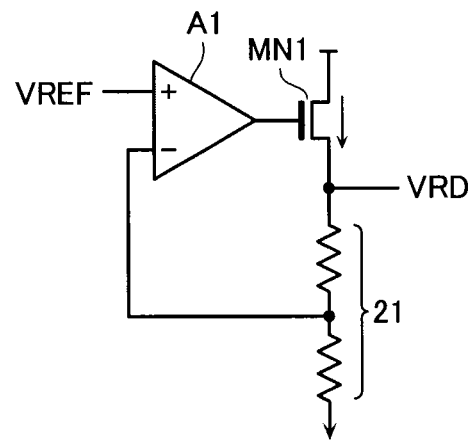
FIG. 22 is an example configuration of a constant voltage generation circuit generating a voltage VRD.

The sources of the p-type MOS transistors MP1 and MP2 are supplied with a voltage VRD. The voltage VRD is generated by a constant voltage generation circuit as shown in FIG. 22. An amplification circuit A1 has a non-inverting input terminal input with a reference voltage VREF and an inverting input terminal input with a voltage of a divider resistor 21. Between a power supply terminal and the ground terminal, an n-type MOS transistor MN1 and the divider resistor 21 are connected in series. The gate of the n-type MOS transistor MN1 is connected to the output terminal of the amplification circuit A1. The source of the n-type MOS transistor MN1 outputs the above voltage VRD. Depending on the voltage VRD, the drain of the n-type MOS transistor MN1 is supplied with the power supply voltage or a voltage generated inside the system that is higher than the power supply voltage. Note that the main amplifier circuit 10B comprises an n-type MMOS transistor MN4 and an inverter INV5. The input terminal of the inverter INV5 is connected to a read line RL. The n-type MOS transistor MN4 is connected between the read line RL and the ground terminal and forms a current path. The gate of the n-type MOS transistor MN4 is applied with a constant voltage supplied by a constant voltage source 51.

Figure 23:
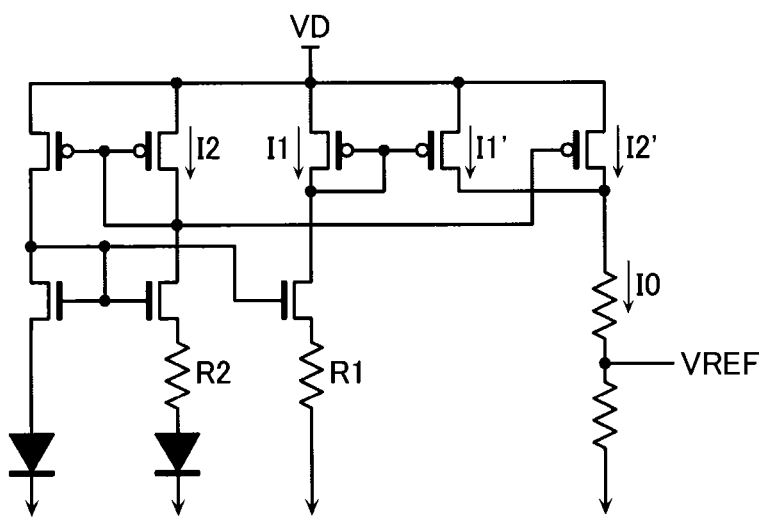
FIG. 23 shows an example configuration of a circuit generating a reference voltage.
Figure 23:
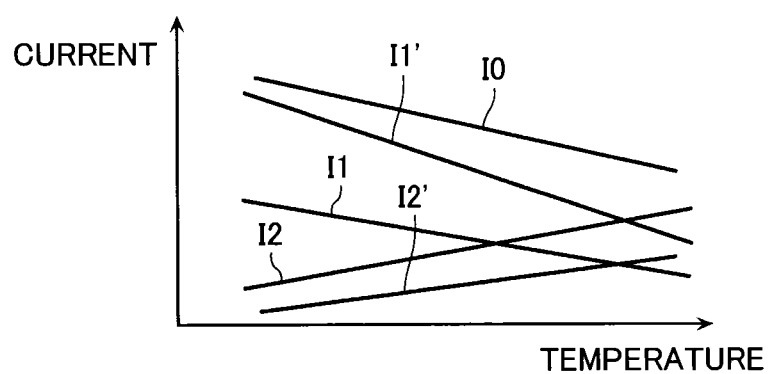
Figure 24:
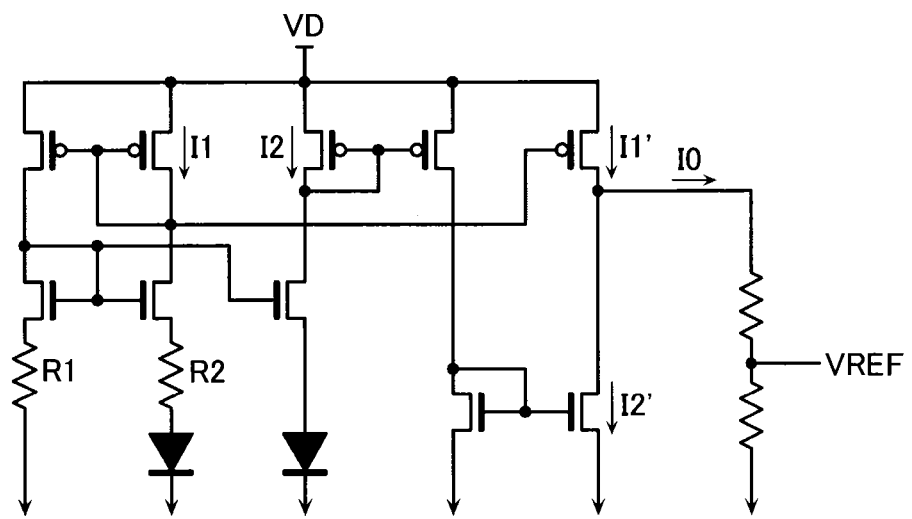
FIG. 24 shows an example configuration of a circuit generating a reference voltage.
Figure 24:
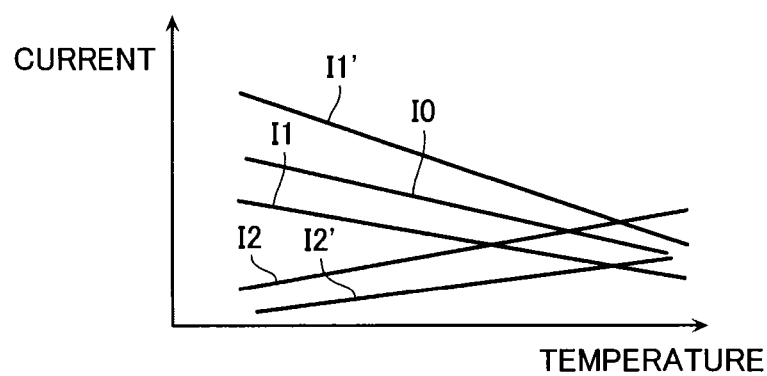
Figure 25:
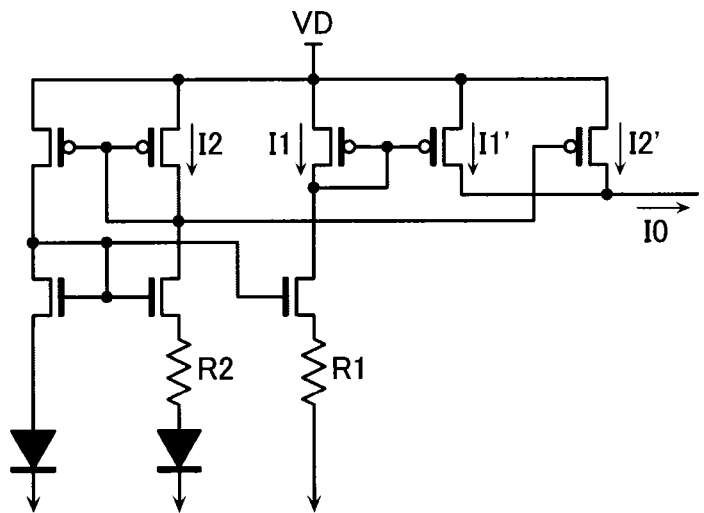
FIG. 25 shows an example configuration of a circuit generating a reference voltage.
Figure 25:
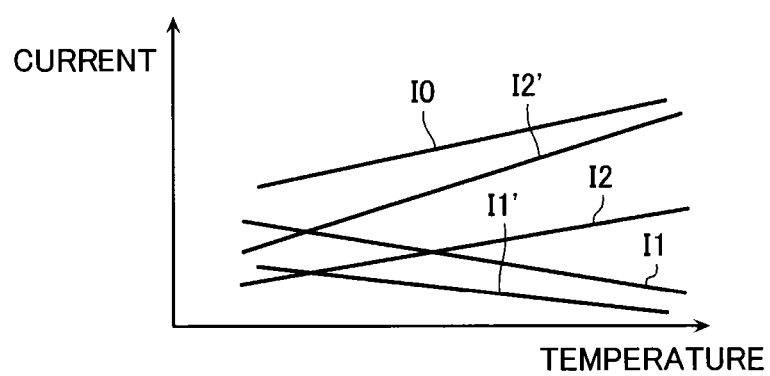
Figure 26:
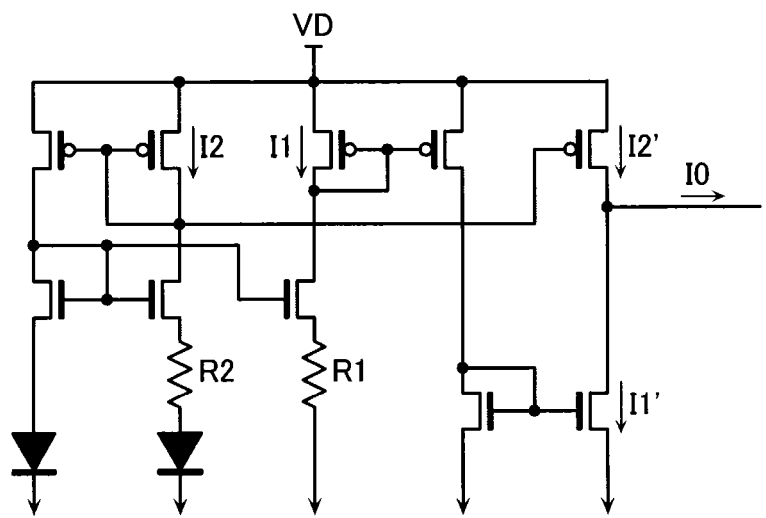
FIG. 26 shows an example configuration of a circuit generating a reference voltage.
Figure 26:
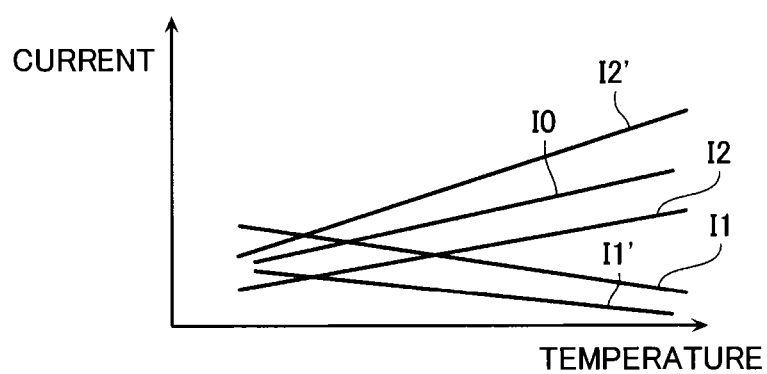

FIG. 23 to FIG. 26 show example configurations of circuits for generating the above reference voltage VREF. FIGS. 23 to 24 show example circuits of which the output voltages VREF have negative temperature characteristics. FIGS. 25 to 26 show example circuits of which the output currents IO have positive temperature characteristics.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A semiconductor memory device comprising:
a memory cell array, the memory cell array comprising a plurality of first wiring lines, a plurality of second wiring lines, and a plurality of memory cells disposed at intersections of the first and second wiring lines; and
a control circuit operative to control voltages supplied to the first or second wiring lines by controlling a select transistor,
the control circuit comprising,
a first power-supply line configured to supply a first voltage supplied to selected ones of the first or second wiring lines, and
first selection circuits connected between the first or second wiring lines and the first power-supply line, each first selection circuit comprising a first transistor and a second transistor connected in series,
the first selection circuits arranged along a first direction being commonly connected to a first selection line,
the first selection circuits arranged along a second direction perpendicular to the first direction being commonly connected to a second selection line,
each of the first and second transistors comprising,
a columnar semiconductor portion extending in a direction perpendicular to a semiconductor substrate,
a gate-insulating film in contact with a side surface of the columnar semiconductor, and
a gate electrode in contact with the gate-insulating film.

2. The semiconductor memory device according to claim 1, wherein
the control circuit is provided below the memory cell array.

3. The semiconductor memory device according to claim 1, wherein
the control circuit further comprises,
a second power-supply line configured to supply a second voltage supplied to non-selected ones of the first or second wiring lines, and
second selection circuits connected between the first or second wiring lines and the second power-supply line, each second selection circuit comprising a third transistor and a fourth transistor connected in series, and wherein
each of the third and fourth transistors comprises,
a columnar semiconductor portion extending in a direction perpendicular to a semiconductor substrate,
a gate-insulating film in contact with a side surface of the columnar semiconductor, and
a gate electrode in contact with the gate-insulating film.

4. The semiconductor memory device according to claim 3, wherein
the first and second transistors are p-type MOS transistors, and
the third and fourth transistors are n-type MOS transistors.

5. The semiconductor memory device according to claim 3, wherein
a pair of the second selection circuits are connected to one of the first or second wiring lines,
the third and fourth transistors included in one of the pair of the second selection circuits have gates connected to the first selection line, and
the third and fourth transistors included in the other of the pair of the second selection circuits have gates connected to the second selection line.

6. The semiconductor memory device according to claim 3, wherein
the control circuit is provided below the memory cell array.

7. The semiconductor memory device according to claim 1, wherein
the first selection line is connected to a gate of the first transistor, and
the second selection line is connected to a gate of the second transistor.

8. The semiconductor memory device according to claim 7, wherein
the control circuit further comprises,
a second power-supply line configured to supply a second voltage supplied to non-selected ones of the first or second wiring lines, and
second selection circuits connected between the first or second wiring lines and the second power-supply line, each second selection circuit comprising a third transistor and a fourth transistor connected in series, and wherein
each of the third and fourth transistors comprises,
a columnar semiconductor portion extending in a direction perpendicular to a semiconductor substrate,
a gate-insulating film in contact with a side surface of the columnar semiconductor, and
a gate electrode in contact with the gate-insulating film.

9. The semiconductor memory device according to claim 8, wherein
a pair of the second selection circuits are connected to one of the first or second wiring lines,
the third and fourth transistors included in one of the pair of the second selection circuits have gates connected to the first selection line, and
the third and fourth transistors included in the other of the pair of the second selection circuits have gates connected to the second selection line.

10. The semiconductor memory device according to claim 1, further comprising,
a pre-amplifier circuit amplifying data read from the memory cell array, and
a main amplifier circuit further amplifying an output signal of the pre-amplifier circuit.

11. The semiconductor memory device according to claim 10, wherein
the main amplifier circuit is commonly provided to a plurality of the pre-amplifier circuits.

12. The semiconductor memory device according to claim 11, wherein
the memory cell array comprises a plurality of memory blocks, and
the pre-amplifier circuit is provided in each memory block.

13. A semiconductor memory device comprising:
a memory cell array, the memory cell array comprising a plurality of first wiring lines, a plurality of second wiring lines, and a plurality of memory cells disposed at intersections of the first and second wiring lines; and
a control circuit operative to control voltages supplied to the first or second wiring lines by controlling a select transistor,
the control circuit comprising a first selection circuit, the first selection circuit being connected to the first or second wiring lines, the first selection circuit being configured to supply a first voltage to selected ones of the first or second wiring lines, and the first selection circuit comprising a first transistor and a second transistor connected in series,
the first selection circuits arranged along a first direction being commonly connected to a first selection line,
the first selection circuits arranged along a second direction perpendicular to the first direction being commonly connected to a second selection line,
each of the first and second transistors comprising,
a columnar semiconductor portion extending in a direction perpendicular to a semiconductor substrate,
a gate-insulating film in contact with a side surface of the columnar semiconductor, and
a gate electrode in contact with the gate-insulating film.

14. The semiconductor memory device according to claim 13, wherein
the control circuit further comprises a second selection circuit, the second selection circuit being connected to the first or second wiring lines, the second selection circuit being configured to supply a second voltage to non-selected ones of the first or second wiring lines, and the second selection circuit comprising a third transistor and a fourth transistor connected in series, and wherein
each of the third and fourth transistors comprises,
a columnar semiconductor portion extending in a direction perpendicular to a semiconductor substrate,
a gate-insulating film in contact with a side surface of the columnar semiconductor, and
a gate electrode in contact with the gate-insulating film.

15. The semiconductor memory device according to claim 14, wherein
the first and second transistors are p-type MOS transistors, and
the third and fourth transistors are n-type MOS transistors.

16. The semiconductor memory device according to claim 14, wherein
 a pair of the second selection circuits are connected to one of the first or second wiring lines,
 third and fourth transistors included in one of the pair of the second selection circuits have gates connected to the first selection line, and
 third and fourth transistors included in the other of the pair of the second selection circuits have gates connected to the second selection line.

17. The semiconductor memory device according to claim 14, wherein
 the control circuit is provided below the memory cell array.

18. The semiconductor memory device according to claim 13, wherein
 the first selection line is connected to a gate of the first transistor, and
 the second selection line is connected to a gate of the second transistor.

19. The semiconductor memory device according to claim 18, wherein
 the control circuit further comprises,
 a second power-supply line configured to supply a second voltage supplied to non-selected ones of the first or second wiring lines, and
 second selection circuits connected between the first or second wiring lines and the second power-supply line, each second selection circuit comprising a third transistor and a fourth transistor connected in series, and wherein
 each of the third and fourth transistors comprises,
 a columnar semiconductor portion extending in a direction perpendicular to a semiconductor substrate,
 a gate-insulating film in contact with a side surface of the columnar semiconductor, and
 a gate electrode in contact with the gate-insulating film.

20. The semiconductor memory device according to claim 19, wherein
 a pair of the second selection circuits are connected to one of the first or second wiring line,
 the third and fourth transistors included in one of the pair of the second selection circuits have gates connected to the first selection line, and
 the third and fourth transistors included in the other of the pair of the second selection circuits have gates connected to the second selection line.

* * * * *